*US008029327B2*

US 8,029,327 B2

(12) United States Patent
Suzuki et al.

(10) Patent No.: US 8,029,327 B2
(45) Date of Patent: Oct. 4, 2011

(54) SEMICONDUCTOR DEVICE AND DISPLAY DEVICE USING A ONE-DIMENSIONAL SUBSTRATE AND DEVICE FABRICATING METHOD THEREOF

(75) Inventors: Tsuneo Suzuki, Tokyo (JP); Takeshi Hirayama, Tokyo (JP); Hisashi Koaizawa, Tokyo (JP); Kiyoshi Yase, Tokyo (JP); Kenkichi Suzuki, Tokyo (JP); Michio Kondo, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 14 days.

(21) Appl. No.: 12/696,670

(22) Filed: Jan. 29, 2010

(65) Prior Publication Data
US 2010/0136870 A1    Jun. 3, 2010

Related U.S. Application Data

(60) Division of application No. 11/377,581, filed on Mar. 17, 2006, now abandoned, which is a continuation of application No. PCT/JP2004/013773, filed on Sep. 21, 2004.

(51) Int. Cl.
*H01J 9/00*    (2006.01)

(52) U.S. Cl. ............................................... 445/23
(58) Field of Classification Search .............. 445/23–25, 445/49–51
See application file for complete search history.

(56) References Cited

FOREIGN PATENT DOCUMENTS

| JP | 2002-184580 | 6/2002 |
|----|-------------|--------|
| JP | 2002-258775 | 9/2002 |
| JP | 2003-174171 | 6/2003 |
| JP | 2004-258206 | 9/2004 |

*Primary Examiner* — Joseph L Williams
(74) *Attorney, Agent, or Firm* — Oblon, Spivak, McClelland, Maier & Neustadt, L.L.P.

(57) ABSTRACT

A display device includes a first fiber having a silicon layer or an oxide layer, on which an active element is formed on the surface of the fiber and a second fiber forming a combined one-dimensional substrate together with the first fiber by being combined with the first fiber and having light emitting layers formed on a plurality of domains of the device. The first fiber and the second fiber are respectively drawn out from take-up jigs, are cut in necessary lengths and separated into plural fibers, and these plural first or second fibers are mounted in parallel with each other on a fixing jig. In this state, at least one-side elements of active elements and passive elements are formed on the first or second fibers.

8 Claims, 24 Drawing Sheets

| | |
|---|---|
| Island | 1 Photo: Formation of Si islands |
| | 2 Etching |
| | 3 Resist removed |
| Gate oxide film on side | 4 Gate oxide film deposited |
| Vth adjustment | 5 Channel implantation |
| | 6 Laser annealing |
| Gate electrode | 7 Gate electrode deposited |
| | 8 Photo: Gate |
| | 9 Etching |
| | 10 Resist removed |
| S/D | 11 Photo: Self-matching LDD/N |
| | 12 N implantation |
| | 13 Resist removed |
| | 14 NM implantation |
| | 15 Photo: P |
| | 16 P implantation |
| | 17 Resist removed |
| | 18 Laser annealing |
| PAS/CONT | 19 PAS $SiO_2$ deposited |
| | 20 Photo: CONT |
| | 21 Etching |
| | 22 Resist removed |
| D-Wiring | 23 Buffer metal deposited |
| | 24 Al deposited |
| | 25 Cap metal deposited |
| | 26 Photo: D-wiring |
| | 27 Etching |
| | 28 Resist removed |
| $H_2$ process | 29 SiN deposited |
| | 30 $H_2$ implanted |
| PAS | 31 PAS $SiO_2$ deposited |
| CONT | 32 Photo: TH |
| | 33 Etching |
| | 34 Resist removed |
| Wiring/pad | 35 Al deposited |
| | 36 Cap metal deposited |
| | 37 Photo: Wiring, pad |
| | 38 Etching |
| | 39 Resist removed |

FIG. 9(a)

| ITO reinforcing electrode | 1 | Al mask deposited |
|---|---|---|
| Organic EL reinforcing film formation | 2 | Hole mobile layer formed |
| | 3 | Light emitting layer formed |
| | 4 | Electron mobile layer formed |
| | 5 | Cathode metal mask deposited |
| Protective film/ contact hole | 6 | Ultraviolet-setting transparent organic film applied |
| | 7 | Mask exposed |
| | 8 | Developed |
| Bump applying | 9 | Ink jet, etc. |

| | | |
|---|---|---|
| Pixel cathode terminal formation | 1 | Metal deposited |
| | 2 | Resist applied |
| | 3 | Exposure |
| | 4 | Development |
| | 5 | Etching |
| | 6 | Resist removed |
| Anode reinforcement and terminal formation | 7 | SiO$_2$ deposited |
| | 8 | Metal deposited |
| | 9 | Resist applied |
| | 10 | Exposure |
| | 11 | Development |
| | 12 | Etching |
| | 13 | Resist removed |
| OELD part SiO$_2$ removal | 14 | Resist applied |
| | 15 | Exposure |
| | 16 | Development |
| | 17 | Etching |
| | 18 | Resist removed |
| OLED part formation (mask deposition) | 19 | Cathode metal mask deposited |
| | 20 | Electron mobile layer formed |
| | 21 | Light emitting layer formed |
| | 22 | Hole mobile layer formed |
| | 23 | ITO buffer film formed |
| | 25 | ITO mask deposited |
| Protective film/ contact hole | 26 | Ultraviolet-setting organic film applied |
| | 27 | Mask exposed |
| | 28 | Development |
| Connection terminal | 29 | Ink jet, etc. |

FIG. 11(a)

One-dimensional substrate manufacturing process
Segment arraying process
TFT and OLED process
Display assembling process
FIG. 12

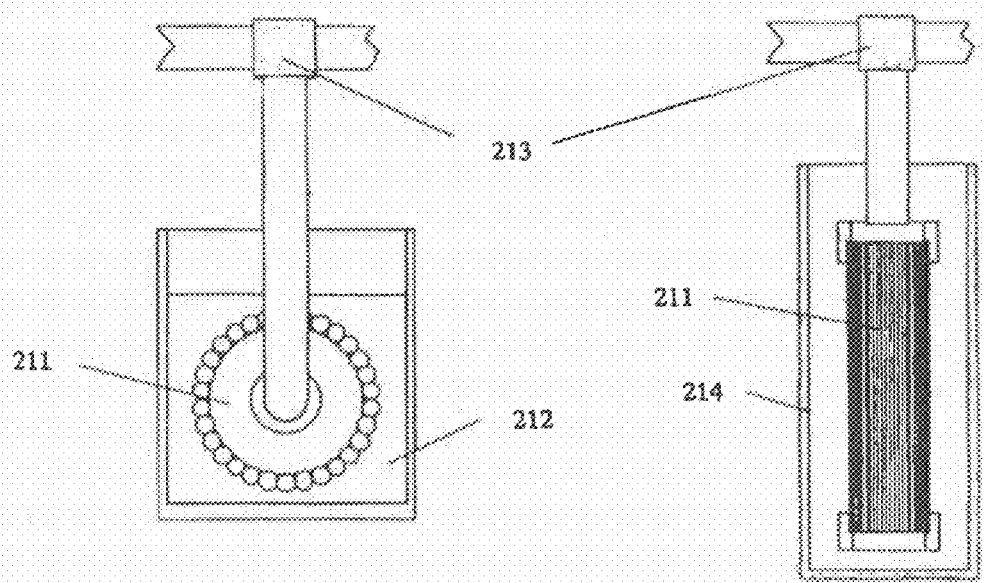
FIG.216(a)
FIG. 21(b)
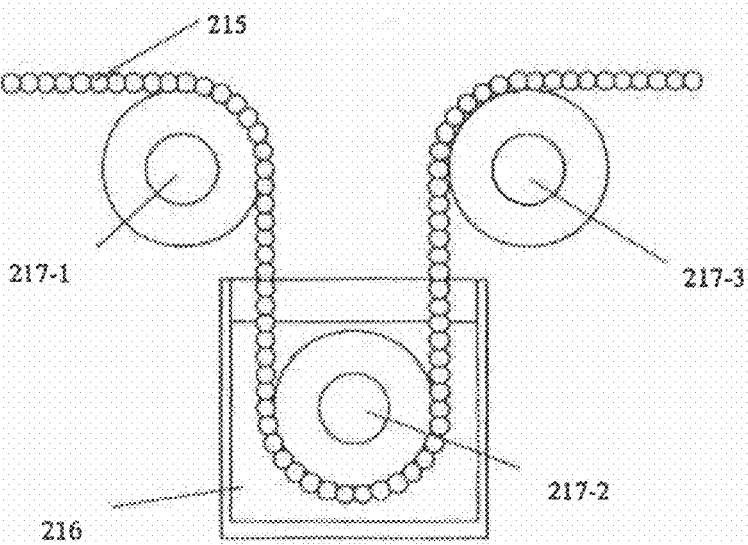
FIG. 21(c)

SEMICONDUCTOR DEVICE AND DISPLAY DEVICE USING A ONE-DIMENSIONAL SUBSTRATE AND DEVICE FABRICATING METHOD THEREOF

CROSS-REFERENCE TO RELATED APPLICATIONS

This application is a divisional of U.S. patent application Ser. No. 11/377,581, filed Mar. 17, 2006, which is a continuation of PCT/JP2004/013773, filed Sep. 21, 2004, which claims priority to U.S. provisional application Ser. No. 60/504,667, filed Sep. 19, 2003. The entire contents of these applications are incorporated herein by reference.

TECHNICAL FIELD

The present invention relates to a semiconductor device, a display device and a device fabricating method, and more particularly to a method of fabricating a semiconductor device forming an organic EL display device or the like and a device such as an organic EL display device and the like.

BACKGROUND ARTS

An active matrix type flat display device being the main current at present is a flat display comprising pixel driving switches composed of TFT (Thin Film Transistor) and a pixel display medium on the surface of it, and a substrate of its starting point is a transparent glass plate of soda lime and the like. Attempts to use a plastic film as a substrate have been performed but do not yet succeed in being put to practical use, and the main current at present is liquid crystal as a display medium and a-Si TFT (Amorphous-Silicon-TFT) as an active matrix, and displays of 10" to 20" in diagonal size are mass-produced for PCs, monitors and the like.

LCD (Liquid Crystal Display) as a display medium has problems in display performance of TV dynamic images, particularly in white, white peak, responsiveness and the like in comparison with CRT (Cathode Ray Tube). On the contrary, organic LED (OLED: Organic Light-Emitting-Diode) of which product development is recently promoted is self-luminous and can realize an image quality being more excellent in white, white peak, responsiveness and the like than LCD.

On the other hand, in TFT also, product development of polycrystalline Si by a low-temperature process (low temperature p-Si) is rapidly promoted. The reason is that first, p-Si is high in TFT performance and can have a peripheral circuit built in it and therefore has an advantage of cost reduction. In addition to this, since a-Si TFT is difficult to cope with drive of organic LED from the viewpoint of a driving current density, the transition of TFT to low-temperature p-Si including application of it to LCD is the general trend.

Market demands in all display devices including an active matrix type flat display device are always three points of the enlargement in size, high definition and cost reduction of display device. For these demands, a-Si TFT-LCD being the main current at present has little room for improvement in performance and is in the state that a substantial limit is TV of 40" in diagonal length for enlargement and display of 20" or less for high definition and the enlargement of glass substrate may be said to be only one means for cost reduction.

On the other hand, low-temperature p-Si TFT-LCD is excellent in performance of TFT itself in principle and can have a peripheral circuit built in it but has grave problems in practice. That is to say, there are various fundamental problems of processes being performed at a low temperature of 500° C. or lower, lack of uniformity due to polycrystal, lithography accuracy of 1 μm or more and the like because of a glass substrate. Particularly, the low-temperature p-Si TFT must realize a performance equivalent to Si LSI in a peripheral circuit but is difficult to realize a high image quality under such restrictions, and is in the state of being applied to some of peripheral circuits of a low-definition display.

In case that a display medium is organic LED, namely, TFT-OLED (TFT-Organic Liquid-Emitting-Diode), the quality of display is greatly improved in comparison with LCD from the viewpoint of self-luminance, high-speed response, thinning and the like. However, since a pixel driving circuit is composed of several transistors instead of one transistor because of current drive differently from LCD. Although there is the attempt to form a pixel driving circuit out of a-Si TFT due to the advantage of uniformity, a large-sized high-definition display cannot but use p-Si TFT.

However, a substrate is of glass and has fundamental problems with respect to TFT itself as described above, and further a large-sized glass substrate cannot but be used for cost reduction similarly to an a-Si-TFT-LCD fabricating technology.

Organic LED is composed of an organic thin film of 5 to 8 layers, the total film thickness of it is about 100 to 500 nm, and the thickness of each component film must be formed with accuracy of about 1 nm. Additionally, pixels corresponding to three colors must be formed separately over a large area. Further, since current consumption is greatly increased to 10 to 100 mA/cm$^2$ due to current drive in case of OLED while current consumption is 1 μA/cm$^2$ due to voltage drive in case of LCD, wiring resistance from a current source needs to be reduced by several digits in comparison with wiring of LCD. It is apparent that the more large-sized and more high-definition a display is, the more difficult the solution of such problems in manufacture is.

These essential problems are in a fact that they are apparently natural, that is, in a fundamental assumption of the prior art using a two-dimensional flat plate as a substrate. That is to say, the improvement in process accuracy is demanded simultaneously with enlargement in size of a substrate and a fabricating apparatus must be made more accurate at the same time as being made large-sized. Naturally there is some limit in mechanism and a limit appears in throughput also. In practice, an a-Si TFT-LED fabricating apparatus coping with a substrate of nearly 2 m square in size is made and used at present, but this is thought to be one limit with respect to cost-performance ratio of apparatus and production line.

The situation in p-Si TFT-LCD based on the existing a-Si TFT-LCD fabricating apparatus and technology is entirely the same. Additionally, p-Si TFT-LCD is in a more difficult situation that a process similar to that of Si LSI must be realized at a low temperature. Cost reduction by having a circuit built-in is one of advantages of p-Si TFT-LCD, but this is realized when a high-performance circuit is implemented. In practice, the more large-sized a substrate is made, the more difficult it is to realize various requirements necessary for a high-performance device such as the quality of film, the accuracy of photolithography, similar processes to those of Si LSI and the like. As for this point, p-Si TFT-OLED is entirely the same and further additionally has problems of LED structure, wiring resistance and the like as described above.

DISCLOSURE OF THE INVENTION

Problems the Invention Attempts to Solve

Although technical problems related to the manufacture in case of using a large-sized substrate have been pointed in the above description, various sizes are demanded in a concrete product development of display. Layout of substrate is not necessarily efficiently performed but may make waste. The optimal size of a substrate used by a manufacturer is not necessarily the optimal size to a user.

An object of the present invention is to provide a semiconductor device using a one-dimensional substrate, a display device and a device fabricating method for solving these various problems in performance and manufacture and further realizing a low cost.

Means for Solving the Problems

A first aspect of the present invention is a semiconductor device having a semiconductor layer formed on the surface of a quartz fiber and an active element formed on said semiconductor layer.

A second aspect of the present invention is a display device being characterized by having a fiber made of a transparent insulating material, an electrode film formed on said fiber and a light emitting layer formed on said fiber.

A third aspect of the present invention is a display device being provided with a first fiber which an active element is formed on, a second fiber which forms a combined one-dimensional substrate with said first fiber by being combined with said first fiber and a plurality of domains of which light emitting layers are formed on.

A fourth aspect of the present invention is a device fabricating method being characterized by comprising a step of drawing out a fiber the surface of which a semiconductor layer or an insulating layer is formed on and which is covered with a protective film from a take-up jig, a step of removing said protective film drawn out from said take-up jig, a step of cutting and separating a portion, from which said protective film has been removed, of said fiber in necessary lengths and into a plurality of fibers, a step of attaching said plurality of fibers to a fixing jig at intervals, and a step of forming at least one-side elements of active elements and passive elements on said fibers.

In order to achieve the above-mentioned object, the present invention proposes a new concept of "one-dimensional substrate" based on a quartz fiber and the like in contrast with a conventional two-dimensional substrate and attempts to solve the above-mentioned problems of a display device. A one-dimensional substrate of the present invention corresponding to a conventional SOI (Silicon On Insulator) substrate has a silicon single crystal thin film or a silicon polycrystal thin film formed on a quartz fiber and hereinafter is referred to as an SOI fiber.

A method of fabricating this one-dimensional substrate is a high-temperature fabricating method of forming a silicon thin film crystal at the same time as drawing a quartz fiber, and further can form a high-quality oxide film for gate by thermally oxidizing the silicon film formed. Hereinafter, this is referred to as an SOI fiber with oxide film. By using these, since a base material is quartz, it is possible to use processes and a process flow being entirely the same as those of a two-dimensional SOI substrate instead of low-temperature processes of a glass substrate and to form various high-performance semiconductor devices.

It is an ITO fiber that corresponds to a two-dimensional ITO (Indium Tin Oxide) glass substrate used in an organic LED. This also forms an ITO film at the same time as drawing a quartz fiber. Since the film can be formed at a lower temperature in comparison with forming a silicon thin film, a plastic fiber may be used. On this, what is called a bottom-emission type organic LED is formed by a process flow similar to a two-dimensional substrate. In this case, three colors of R, G and B are formed on fibers independent of one another.

In an active matrix type TFT-OLED, a pixel driving circuit composed of MOS transistor elements is formed starting at an SOI fiber. In this case, it is acceptable to form organic LED's on the same fiber or to form organic LED's on another fiber and combine both fibers. Whether a single or combined fiber, pixels corresponding to the number of rows are regularly arranged correspondingly to pixel pitches in the direction perpendicular to the display screen on one fiber to form one column of the display screen. In case of a single fiber, a method of OLED is limited to a front emission, but in case of a combined fiber, both of bottom and front methods can be used. Further, the case of a combined fiber is advantageous in that different technologies of TFT and OLED can be developed and improved independently of each other.

As described above, although a "substrate" is in a special shape of fiber, a conventional SOI process and an organic LED process are applied as they are. However, two factors must be considered in order to manufacture this.

A first factor is the shape of fiber. In order to make a luminous body like OLED, a conventional circular or elliptic section is advantageous. On the other hand, it is apparent that a square (its corners are rounded in practice) is advantageous as SOI. Thus, the shape must be selected according to application.

A second factor is a fabricating method specific to fiber, and two methods are conceivable.

As a first method, there can be conceived a fundamental production line in which a fiber of necessary length is wound around a take-up jig in advance, a fiber drawn out from this passes through apparatuses corresponding to processes and is wound around another take-up jig. Various combinations based on properties of processes and cost-effectiveness are conceivable with regard to the number of apparatuses to be installed between the two take-up jigs, namely, the number of processes, the length of apparatuses for one fiber, the number of fibers in parallel, and whether intermittent traveling or uniform traveling. In this case, an essential subject is throughput and is fundamentally to make one fiber travel uniformly at a speed as high as possible. The reason is that a process proceeds collectively over a large area in a conventional flat substrate but a process proceeds fundamentally in pixels in case of a quartz fiber. That is, since this is the same as a fact that a "point" corresponding to one pixel scans a two-dimensional plane, a process time for each pixel is made very short and a high-speed process being higher by 3 to 6 digits is made necessary for realizing the same throughput as a conventional method. The uniform traveling speed is a necessary property of the apparatuses for making synchronization or for keeping the uniformity in film formation and etching in case of forming a pattern on a substrate traveling like in an exposure process as described above. In this method, a fabricating apparatus is made "one-dimensional" in a way and very small-sized, and a high-speed process is conceived to be made realizable by replacing a vapor-phase process which a conventional flat substrate is based on with a liquid-phase process.

A second method is either a method of cutting the above-mentioned one-dimensional substrate in proper lengths and arranging and fixing these cut fibers on the surface of a circular cylinder or a polygonal prism, and using this as a substrate, or a method of making them into the shape of a "reed screen" and using this as a so-called roller method. The former is a structure in which a flat substrate is rounded in the shape of a cylinder in a way, and a fabricating apparatus of it is greatly reduced in size in comparison with that of a flat substrate. Further, it is possible to increase greatly a process rate at the same time as miniaturization of apparatuses by making process regions into a linear shape corresponding to the fiber and using a concentrated system of an exposure source, a vapor deposition source, an ion source, a plasma source and the like.

BRIEF DESCRIPTION OF THE DRAWINGS

FIG. 1(a) shows an SOI substrate in which an Si thin film crystal is formed on a quartz fiber being square in section (its corners are rounded in practice) as a concrete example.

FIG. 2(a) is a bird's-eye view of a configuration in which square fibers having pixel driving circuits and wiring deposited in layers on them and round fibers having OLED's formed on them are combined, and gate lines are connected to the lower surface of the square fibers.

FIG. 3(a) is a view of wiring of a pixel driving circuit, a connection pad to OLED fiber, a signal line and a current feed line seen from one side, and the wiring is continuous on the axis of fiber, and the pixel driving circuit and the connection pad to OLED fiber are repeated at intervals of pixel pitch with the same pattern.

FIG. 4(a) is a sectional view of a bottom emission type, and OLED is formed in the third and fourth quadrants, and emitted light is outputted from the first and second quadrants.

FIG. 5(a) is a sectional view, and OLED is formed in the first and second quadrants, and emitted light is outputted from there.

FIG. 12 is a figure showing a fabricating process of a one-dimensional substrate and a display device using the same.

In FIG. 15(a), a "substrate jig" is cylinder-shaped or round column-shaped and fibers are arranged and fixed on the surface of this.

FIG. 16(a) shows a method using ion cluster beams, metal spraying, atmospheric pressure plasma and the like, and a convergent beam-shaped or concentrated plasma state, and FIG. 16(b)(i), (b)(ii) show two forms of cylinder-type CVD apparatuses.

FIG. 17 is a figure showing a principle of an apparatus applying resist, organic films and the like.

FIGS. 21(a), (b) (c) are figures showing principles of wet processes such as development, exfoliation, wet etching, washing and the like. FIG. 21(a) shows a wet tab of a horizontal type, FIG. 21(b) shows a wet tab of a vertical type and FIG. 21(c) shows a wet method adapted to a reed-screen substrate.

FIG. 22(a) shows a method of depositing bumps on a cylindrical substrate and FIG. 22(b) shows a method of connecting an OLED fiber to a TFT fiber.

FIG. 23(a) shows a frame for arranging.

FIG. 24(a) shows a frame for arranging gate lines.

FIG. 26(a) shows a frame for arranging common lines.

DESCRIPTION OF THE SYMBOLS

Figure 1A:
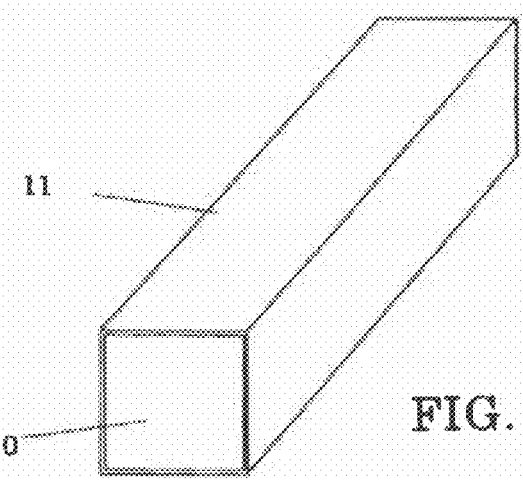
FIGS. 1(a), (b), (c) are figures showing the concept of one-dimensional substrates.

10: Quartz fiber of a square section, 10': Quartz fiber of a round section, 11: Si thin film crystal, 11': ITO, 12: Thermal oxide film, 20: TFT fiber, 21: OLED fiber, 25, 25': FPC or PCB, 26, 26': External driving circuit and the like, 31: Pixel driving circuit, 32: Connection pad to OLED fiber, 33: Signal line, 34: Current feed line, 35: Gate line connecting pad, 36:

Signal line terminal, 37: Current feed line terminal, 41: ITO, 42: OLED layer, 43: Cathode, 44: Transparent organic protective film, 45: ITO reinforcing line, 46: Connection pad to TFT substrate, 50: Quartz fiber, 51: Underlay electrode, 52: Cathode, 53: Organic EL layer, 54: ITO, 55: Inorganic passivation film, 56: ITO reinforcing electrode, 57, Transparent organic protective film, 58: Pad, 60: Pixel driving circuit, 61: ITO common electrode, 62: Organic EL layer, 63: Cathode, 64: Common electrode line (ITO reinforcing electrode), 65: TFT fiber and OLED fiber connecting pad, 66: Signal line, 67: Current feed line, 68: Gate line, 70: TFT fiber, 71: OLED fiber, 72: Gate line, 73: Common line, 74: Black resin, 75: Transparent resin, 76, 76': Barrier film, 80: TFT fiber, 81: OLED fiber, 82: Gate line, 83, 83': Common line, 84: Black resin, 85: Transparent resin, 86, 86': Barrier film, 87, 87': External driving IC and the like mounting TAB or FPC, 88, 88': PCB or frame, 90: Thin film Si crystal, 91: Gate oxide film, 93: Gate electrode, 941: Source, 942: Drain, 951, 052: LDD, 961-963: Through hole, 971-973: Contact and wiring, 98: Second interlayer insulating film, 991-993: Contact and wiring, 100: Quartz fiber, 101: ITO, 102: ITO reinforcing electrode, 103: Organic EL layer, 104: Cathode, 105: Transparent organic protective film, 106: Pad, 110: Quartz fiber, 111: Underlay electrode, 112: ITO reinforcing electrode, 113: Inorganic passivation film, 114: Cathode, 115: Organic EL layer, 116: ITO, 117: Transparent organic protective film, 118: Pad, 131: Quartz fiber drawing portion, 132: Si, ITO and the like film forming portion, 133: Resist protective film applying portion, 134: Drying portion, 135: Winding mechanism, 141: One-dimensional substrate reel, 142: One-dimensional substrate, 143: Resist exfoliation, 144: Fiber segmenting head, 145: Substrate jig, 146: Fiber traveling adjustment, 151: Segmented one-dimensional substrate, 152: Cylinder- or round column-shaped substrate jig, 153, 153': Fixing ring, 154: Support, 155: Micro-clamp, 156: Micro-chain, 160: Vacuum chamber, 161: Cylinder- or round column-shaped substrate, 162: Process head, 163: Rotating mechanism, 164: Cylinder-type CVD, dry etching and plasma doping apparatus, 165: Cylinder-type CVD, dry etching and plasma doping apparatus (also used as a substrate jig), 166: Cylinder-type sputtering, dry etching and plasma doping apparatus, 167: Target or electrode, 168: Target or electrode of cylinder-type sputtering, dry etching and plasma doping apparatus (also used as a substrate jig), 170: Cylinder- or round column-shaped substrate, 171: Resist or resin dripping jig, 172: Rotating mechanism, 180: Cylindrical substrate, 181: Rotating and translating mechanism, 182: Reducing projection image forming lens, 183: Mask holder and lens servo control mechanism, 184: Illumination optical system, 185: Excimer laser, 186: Fiber position detecting head, 187: Signal transmission, 188: Signal processing, 188: Servo control computer, 189: Servo control data transmission, 190: Collimated excimer beam, 191, 192: Split lens, 193: Secondary light source, 194: Condenser lens, 195: Field lens, 196: Mask, 197: Image forming lens, 198: Entrance pupil, 199: Image plane, 201: SOI fiber, 202: Cylindrical lens, 203: Mask, 204: Collimated excimer beam, 211: Cylinder- or round column-shaped substrate, 212: Horizontal-type tab, 213: Carrying and rotating mechanism, 214: Vertical-type tab, 215: Reed screen-shaped substrate, 216: Horizontal-type tab, 217-1-3: Rotating and carrying mechanism, 221: Cylinder- or round column-shaped substrate, 222: Rotating and carrying mechanism, 223: TFT fiber, 224: Ink jet head, 225: OLED fiber, 226: TFT fiber, 227: Fiber holding, positioning and fixing jig, 231: Combined fiber, 232: Combined fiber fixing frame, 233: OLED fiber, 234: TFT fiber, 235: Part of the fixing frame, 241: Gate line fixing frame, 242: OLED fiber, 243: TFT fiber, 244: Gate line, 245: Part of the combined fiber fixing frame, 251: Gate line, 252: TFT fiber, 253: Micro-welder head, 254: Trapezoidal reflecting mirror, 255: Plane mirror, 256: Condenser lens, 257: YAG laser, 258: Bump, 261: Common line fixing frame, 263: Common line, 264: OLED fiber, 265: TFT fiber, 266: Part of the common line fixing frame.

BEST MODE FOR CARRYING OUT THE INVENTION

Figure 1B:
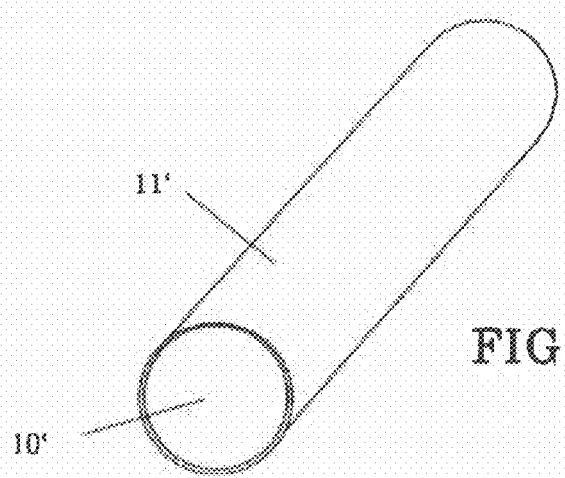
FIG. 1(b) shows an ITO substrate in which an ITO film is formed on a quartz fiber being circular in section as a concrete example.
Figure 1C:
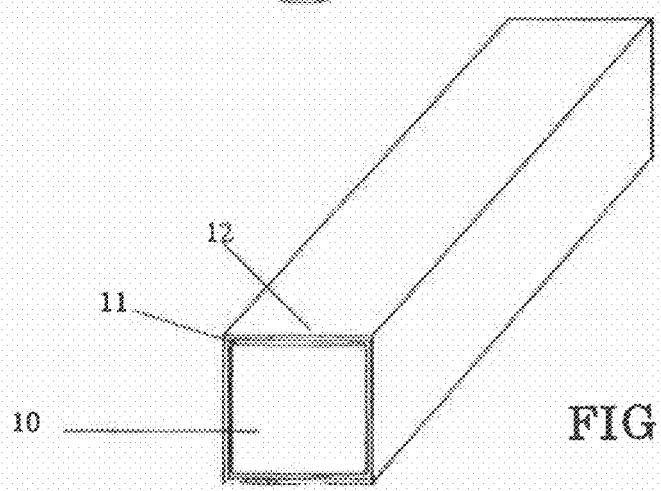
FIG. 1(c) shows a structure in which a thermal oxide film is formed on an Si film of FIG. 1(a).

Embodiments according to the present invention are described with reference to the drawings in the following. FIGS. 1(*a*), (*b*), (*c*) show a conceptual view of a one-dimensional substrate having a quartz fiber as its base material.

In FIGS. 1(*a*), (*b*), (*c*), symbols 10 and 10' are quartz fibers, which are made by the same method as a process of drawing an optical fiber. FIGS. 1(*a*), (*b*) show respectively circular and square sections as examples, but they can be elliptic, rectangular or tube-shaped according to applications. The diameter of a fiber or the length of one side of a fiber is made to be 800 μm or less so as to enable the fiber to be wound. Symbol 11 is a single crystal or polycrystal film of Si, which is referred to as an SOI fiber, and the thickness of an Si film in this case is about 100 nm. In FIG. 1(*c*), symbol 12 is an oxide film such as a thermal oxide film or the like formed on the surface of Si. A one-dimensional substrate in a second category is a substrate on which a transparent electrode of ITO, zinc oxide, tin oxide or the like of about 100 nm in thickness is formed instead of Si in FIGS. 1(*a*), (*b*). In this case, since a high temperature enough to form an Si film is not necessary, it is possible also to use multi-component glass, plastic base materials and other transparent insulating materials instead of quartz.

Figures 2A, 2B:
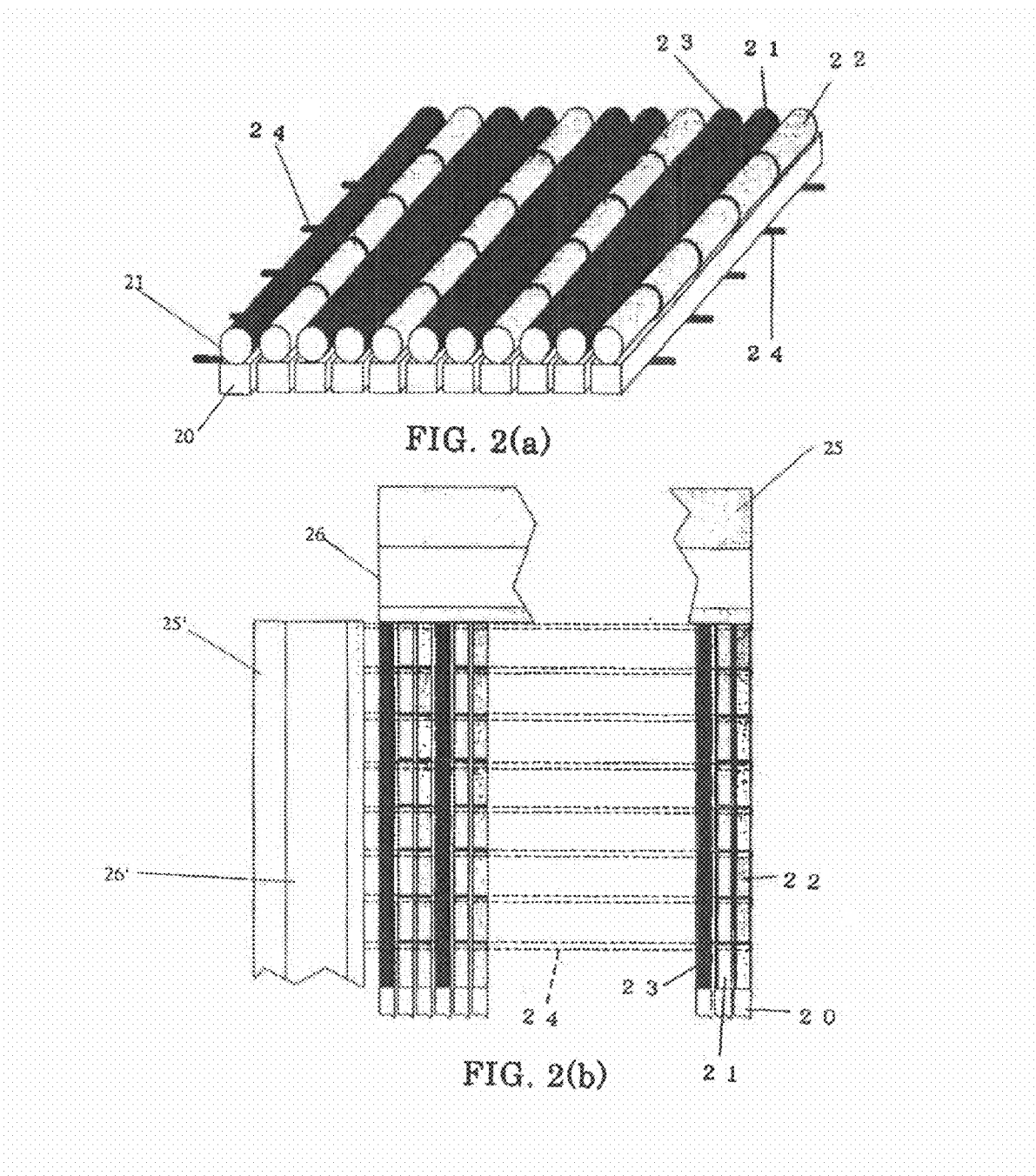
FIGS. 2(a), (b) are figures showing the concept of a display device formed out of a one-dimensional substrate.
FIG. 2(b) is a figure showing the connection between the said display screen and an external circuit.

FIG. 2(*a*) shows the concept of a TFT-OLED configuration using combined one-dimensional substrates having square-shaped SOI fibers 20 on which pixel driving circuits and wiring are formed and circle-shaped ITO fibers 21 to 23 on which a plurality of organic LED's are formed. A plurality of ITO fibers 21, 22 and 23 on which the respective pixel columns of R, G and B (red, green and blue) are formed are arranged at intervals of pixel pitch, and gate lines 24 are connected so as to cross them at right angles. An end portion of each line is fixed on a wiring board (PCB: Printed Circuit Board) 25 or 25' and is connected to a driver IC chip 26 or 26' mounted on the board as shown in FIG. 2(*b*). For example, a plurality of red pixels (organic LED) are formed in a line on a first ITO fiber 21, a plurality of green pixels are formed in a line on a second ITO fiber 22, and a plurality of blue pixels are formed in a line on a third ITO fiber 23.

Figure 3A:
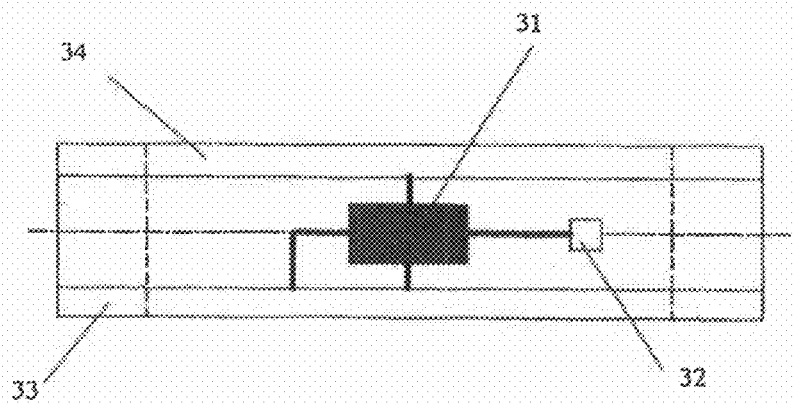
FIGS. 3(a), (b), (c) are figures showing the arrangement of a pixel driving circuit and wiring on a square fiber.
Figure 3B:
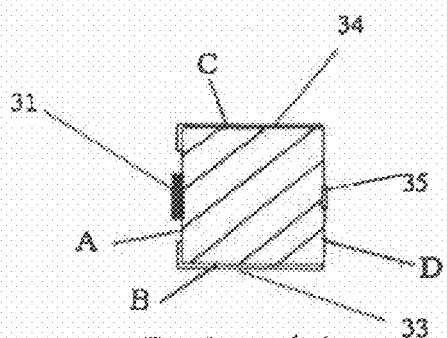
FIG. 3(b) is a sectional view of the square fiber. The signal line and the current feed line run on two sides crossing the first side at right angles.
Figure 3C:
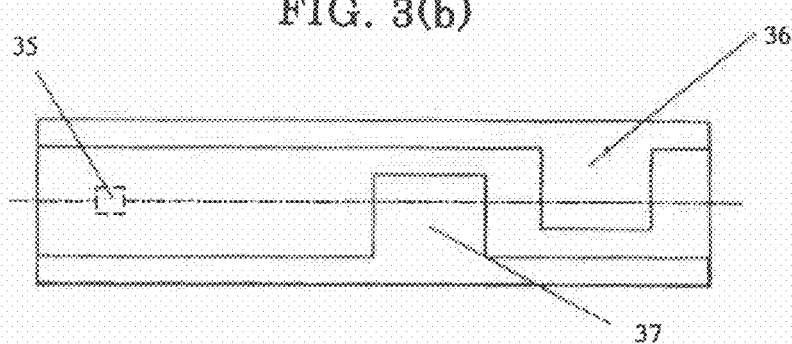
FIG. 3(c) shows terminal parts of the signal line and the current feed line in a terminal portion on the same side as FIG. 3(a).

FIG. 3(*a*) shows a sectional view of a square-shaped SOI fiber on which a pixel driving circuit and wiring are formed, and FIGS. 3(*b*), (*c*) show plan views of it. An organic EL (electroluminescence) pixel driving switch circuit 31 is formed on a face (A). And a connection terminal 32 to an organic LED, part of a signal line 33 and part of a current feed line 34 are formed on the same face and they each are connected to the driving switch circuit 31. The signal line 33 and the current feed line 34 respectively pass through faces (B) and (C) perpendicular to face (A) and reach parts of a face (D) opposite to face (A), and extend in the longitudinal direction of fiber over the whole fiber. FIG. 3(*c*) shows the configuration in the vicinity of a fiber terminal on the side (D), and symbol 35 is a pad for a gate line, and 36, 37 are respectively terminal pads of the signal line and current feed line. The driving switch circuit 31 is composed of active elements such as MOS transistors and the like.

Figures 4A, 4B:
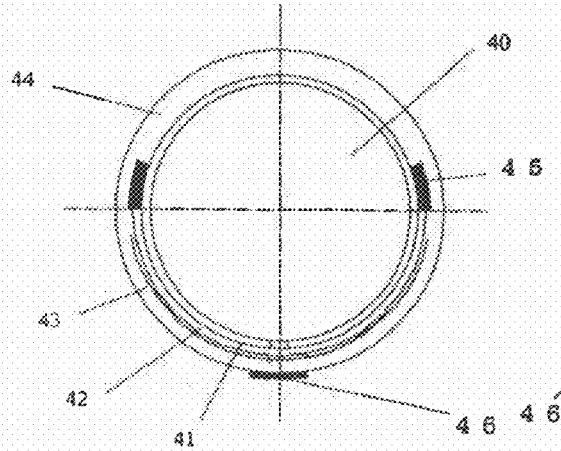
FIGS. 4(a), (b) are figures showing the structure of a round-shaped OLED fiber.
FIG. 4(b) is a plan view seeing the pad direction.

A sectional view of a circle-shaped ITO fiber is shown in FIG. 4(a) and a plan view in case that this is seen from below is shown in FIG. 4(b). This is the configuration of what is called a bottom emission type organic LED, in which an organic EL film 42 is stacked on an ITO film 41 formed on the surface of a quartz or plastic fiber 40 and a cathode metal film 43 separated for each pixel is formed on this film 42. The organic LED is formed so as to be accommodated in the third and fourth quadrants (lower half of the figure) in FIG. 4(a), and emitted light is outputted from the first and second quadrants (upper half of the figure). A pad 46 for passing through a protective film 44 and connecting to the SOI fiber is formed for each pixel. A metal electrode 45 is formed on a part which does not interfere with OLED and the light output face in the longitudinal direction in order to reinforce the resistance value of ITO, and is made to be capable of coping with a large-sized display screen.

Figures 5A, 5B:
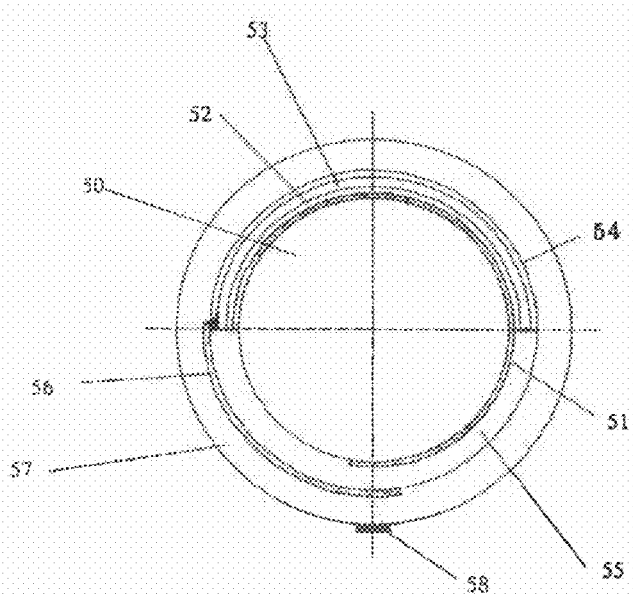
FIGS. 5(a), (b) are figures showing the structure of a round-shaped front emission type OLED fiber.
FIG. 5(b) is a plan view.

In addition to the above-mentioned system, there is what is called a front emission type organic LED system, and a sectional view and a plan view of it are shown in FIGS. 5(a), (b). An underlay metal film 51 and a cathode metal film 52 separated for each pixel are formed on the surface of a quartz or plastic fiber 50 and an insulating layer 55 is formed on a part other than a light emitting surface. An organic EL layer 53 is formed so as to be accommodated in the first and second quadrants in FIG. 5(a), and an ITO film 54 being a full-surface electrode is formed on this film 53. The underlay metal film 51 extends into the third and fourth quadrants, and a pad 58 for passing through the insulating layer 55 and a protective film 57 and connecting to the SOI fiber is formed for each pixel. An ITO reinforcing electrode 56 is formed on the region other than the pad 58 and the light emitting surface.

As the above-mentioned organic EL layered structure, a structure of 2 to 6 layers is used. A configuration and material for each color are as follows.

Figure 6:
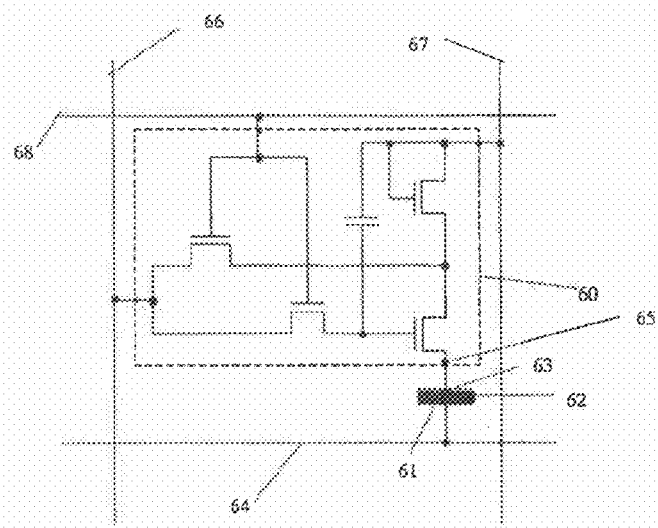
FIG. 6 is a pixel driving circuit diagram.

FIG. 6 shows an example of an equivalent circuit of a fiber TFT-OLED. In FIG. 6, symbol 60 is a pixel driving circuit corresponding to 31 in FIG. 3, 61 is an ITO electrode of an organic LED, 62 is an organic EL layer, 63 is a cathode, 64 is a common line including ITO and a reinforcing electrode, and 65 is a bump for connecting to an SOI fiber. The symbols 61 to 65 correspond to an OLED fiber. Symbol 66 is a signal line, 67 is a current feed source line, and the symbols 60, 66 and 67 correspond to an SOI fiber. Symbol 68 is an external gate line.

Figure 7:
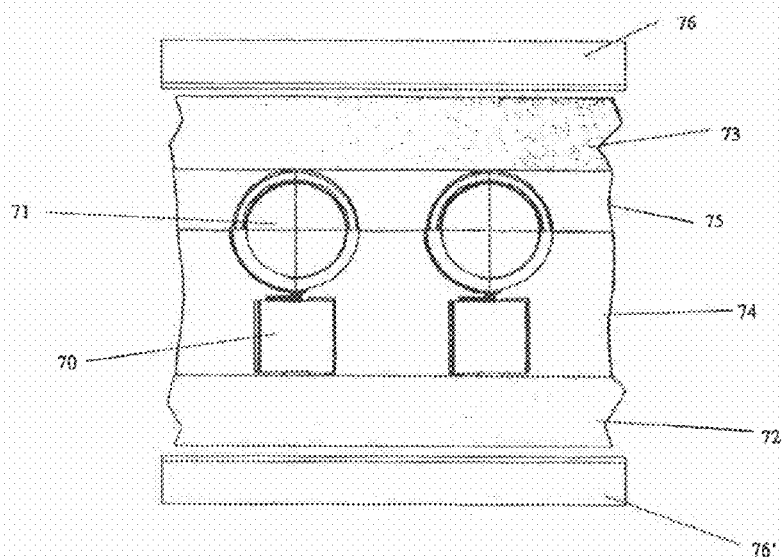
FIG. 7 is a view of a laminate structure of a display device formed out of combined one-dimensional substrates seen from a section perpendicular to the combined fibers.

FIG. 7 is a sectional view of a fiber TFT-OLED structure in a perpendicular direction to the fiber. Each combined line of an SOI fiber 70 and an OLED fiber 71 corresponds to a pixel column of R, G and B in the vertical direction of a display, namely, in the column direction. A gate line 72 is connected to each pixel, while it is enough that one or two external common lines 73 are only at ends of the display screen. The reason is that a reinforcing metal electrode is attached to an ITO common electrode. A net of fibers composed of the symbols 70 to 73 has a black insulating resin 74 laminated onto the lower part of the light emitting portion of the OLED fiber and a transparent resin 75 laminated onto the upper part, and further have barrier films 76 and 76' against moisture, oxygen and the like laid respectively on the upper and lower faces for protection of the organic EL.

Figure 8:
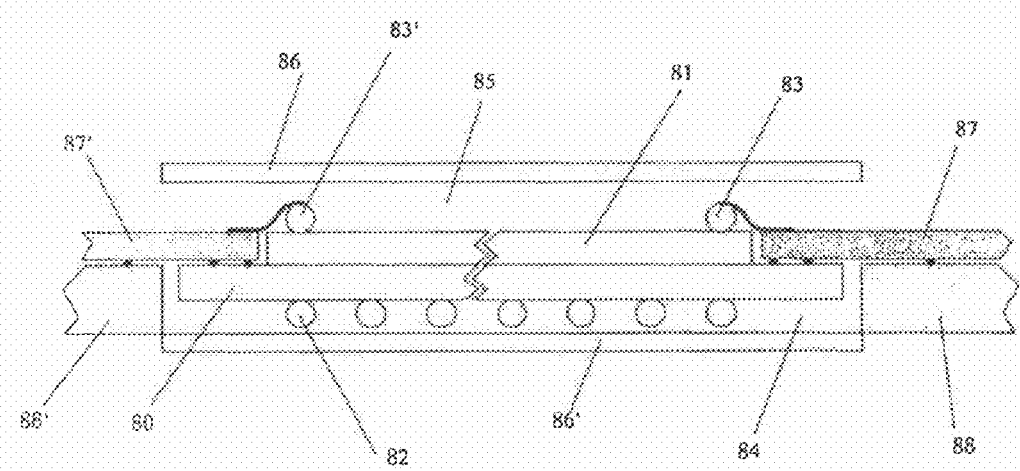
FIG. 8 is a view of a laminate structure of a display device formed out of combined one-dimensional substrates seen from a section parallel with the combined fibers, and particularly showing the configuration in the vicinity of terminals.

FIG. 8 is a sectional view of a fiber TFT-OLED structure in the parallel direction with the fiber, and particularly shows the configuration in the vicinity of terminal portions of it. A gate line 82 is connected to each pixel so as to intersect a combined TFT-OLED fiber composed of an SOI fiber 80 and an OLED fiber 81 at right angles. It is enough that common lines 83 and 83' for connecting common electrodes of OLED exist only at end parts of the display screen. A signal line and a current feed line on each fiber are connected to an external circuit. Here, they are connected to TAB or FPC 87 and PCB 88 mounted with driving ICs. Barrier films 86 and 86' are arranged further outside the gate line 82 and the common lines 83 and 83'.

In the above-mentioned display device, a combined one-dimensional substrate is formed by combining a one-dimensional substrate on which a pixel driving circuit 31 composed of MOS transistors and the like formed on an SOI fiber 20 has been formed and a one-dimensional substrate composed of organic LED pixels formed on ITO fibers 21 to 23 with each other at each corresponding pixel. This combined one-dimensional substrate forms one column of the display screen.

Additionally, in order to introduce an image signal from the outside into each pixel from one end of a fiber, a signal line 33 of a linear conductor running in the longitudinal direction of fiber and a current feed source 34 of a linear conductor for feeding current to be put into an organic LED 42 or 53 forming each pixel are formed on the same SOI fiber 20.

These combined fibers 20 to 23 are arranged regularly correspondingly to pixel pitches in the horizontal direction of the display screen in number necessary for the number of columns of the display screen, and perpendicularly to these combined fibers 20, gate lines 24 of linear conductor for introducing signals of timing and the like for pixel display into pixel driving circuits 31 are connected to SOI fibers 20. And common electrode lines 61 for commonly connecting transparent electrodes 41 or 54 being the emitted light outputting faces of the ITO fibers 21 to 23 provided with organic LED's 42 or 54 are connected.

External driving circuits 26 and 26' for applying a signal for driving a pixel or a control signal to the ends of these signal line 33 and gate line 24 on the fiber 20 are connected to a current source common to each current feed source 34, and a same potential source is connected to each common electrode line 61. The whole net formed in such a way is provided with a transparent organic resin or the like having rigidity or flexibility on the light emitting side of it and a black organic resin or the like on the opposite side and the above-mentioned meshed display screen is protected by both of these resins and thereby a TFT-organic LED light emission type display device flattened to 3 mm or less in thickness is formed. An SOI fiber with oxide film may be used in place of the SOI fiber 20.

Figure 9B:
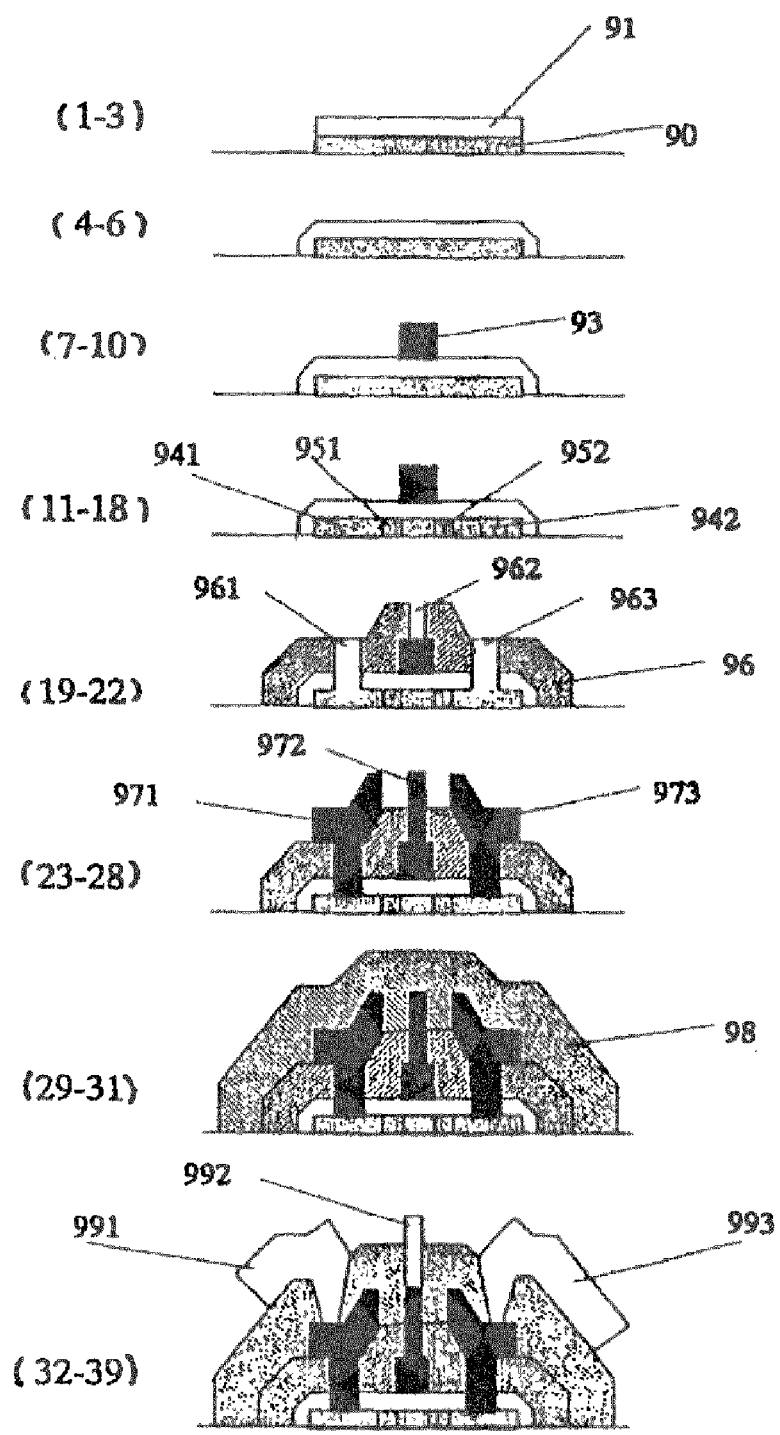
FIGS. 9(a), (b) are figures showing a process flow of TFT starting at an SOI substrate with oxide film.

FIGS. 9(a), (b) are figures showing an example of a TFT process in case of using an SOI fiber with oxide film. First, as shown in steps (1-3) of FIGS. 9(a), (b), an island of a silicon film 90 including an oxide film 91 is formed. In case that a pixel driving circuit of FIG. 6 is made to be n-channel as a whole according to the design rule of 0.5 μm and a layout in case of "L/W=2/2 μm" is performed, the area of a circuit portion is 28×24 μm. Even if various circuit forms other than this are adopted, it is enough that the area of an island is 50 μm$^2$.

Next, as shown in steps (4-6) and (7-10) of FIGS. 9(a), (b), the side faces of the silicon film 90 are covered with an oxide film by means of plasma oxidation, thermal oxidation, oxide film formation and the like, and a gate electrode 93 is formed on the oxide film. Metal tungsten, tungsten silicide or the like was used as the gate electrode 93. Subsequently, as shown in steps (11-18) of FIGS. 9(a), (b), a structure of n-channel in which source and drain domains 941 and 942 have LDD (Lightly Doped Drain) domains 95 of about 1 μm in width is formed. In introduction of impurities, first a low-concentration ion implantation was performed and next a high-concentration ion implantation was performed after adjusting the thickness of resist film covering end portions of the gate electrode 93 so as to be 1 μm. As another method of introducing impurities, windows having areas corresponding to source and drain domains were made in the oxide film and first a low-concentration ion implantation was performed by plasma doping and next in the same manner as described above, a high-concentration ion implantation was performed by plasma doping after adjusting the thickness of resist film covering end portions of the gate electrode 93 so as to be 1 µm.

In either method, thereafter, as shown in steps (19-22) and (23-28) of FIGS. 9(*a*), (*b*), a first interlayer insulating film 96 was formed and through holes 961, 962 and 963 were made in this film, and the respective wirings 971, 972 and 973 of the source, gate and drain were formed. At this time, Ti was used as barrier metal and Al was used as metal for wiring. At this stage, wiring for connecting elements in the pixel driving circuit and part of wiring from the circuit to a signal line and a current feed line are formed.

Further, as shown in steps (29-31) and (32-39) of FIGS. 9(*a*), (*b*), a second interlayer insulating film 98 was formed, and part of connection to said pixel driving circuit and a pad for gate and wirings 991 to 993 in the circuit were performed. Next, an Al film for wiring is formed on a side face of the fiber and the connection between a wiring pattern and the circuit is completed, and next the second interlayer insulating film is formed again on the side face and an Al film is formed and patterned and the connection to the pad for gate is completed.

Figures 10A, 10B:
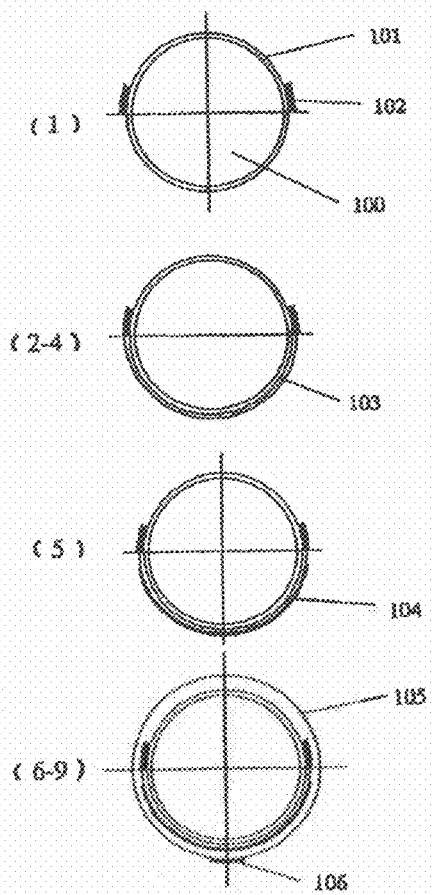
FIGS. 10(a), (b) are figures showing a process flow of a bottom emission type OLED using an ITO substrate.

On the other hand, a process diagram of an OLED fiber (sectional view) is shown in FIGS. 10(*a*), (*b*). An illustrated method is of a bottom emission type. As shown in step (1) of FIGS. 10(*a*), (*b*), a one-dimensional substrate at the starting point is what is called an ITO fiber on which an ITO film 101 has been formed in advance. On this, an Al reinforcing line 102 was formed by means of mask formation or resist lift-off. The first and second quadrants in case of representing a sectional view in the figures in the X-Y coordinates are the output face of an EL luminescence, and as shown in steps (2-4) of FIGS. 10(*a*), (*b*), an EL layer 103 is formed in the third and fourth quadrants. Then, as shown in step (5) of FIGS. 10(*a*), (*b*), a cathode metal electrode 104 on the EL layer 103 is separated for each pixel and formed by mask vapor deposition. Further, as shown in steps (6-9) of FIGS. 10(*a*), (*b*), a transparent photosensitive resin 105 is applied to all over them and is exposed and hardened except a through hole to a cathode. An unexposed part is made into a through hole by development and is made into a connection pad to the SIO fiber by filling this hole with low-melting point solder, conductive adhesive or the like 106 by means of ink jet, dispenser or the like.

Figure 11B:
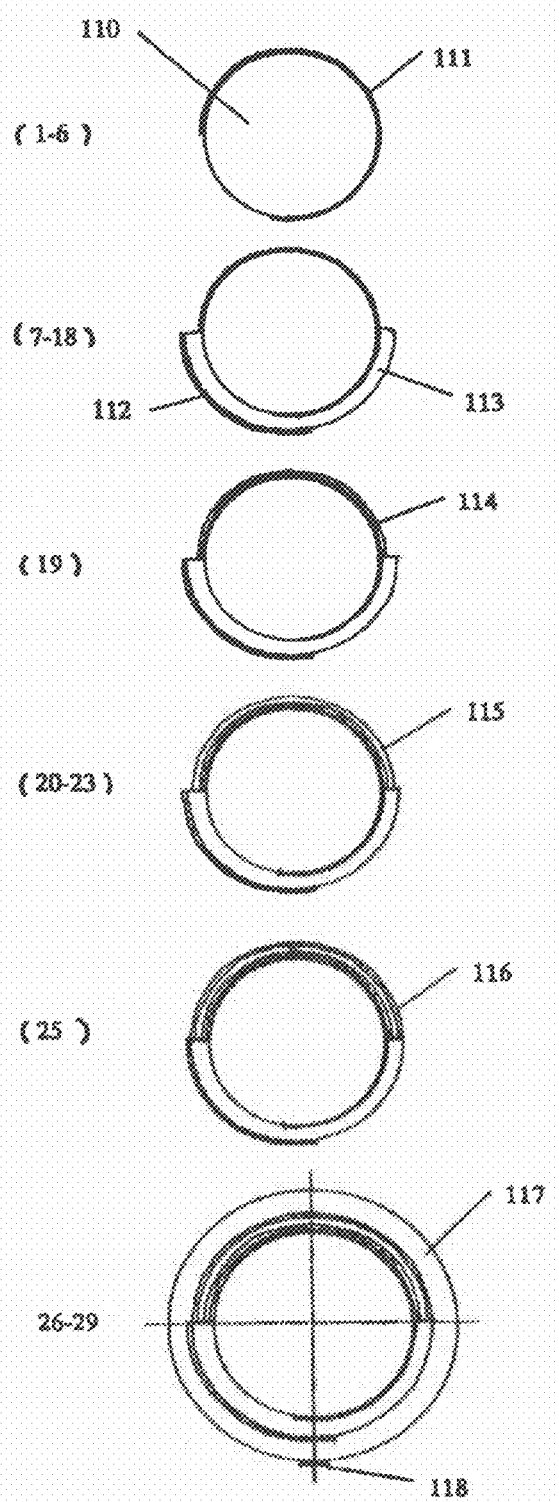
FIGS. 11(a), (b) are figures showing a process flow of a front emission type OLED starting at a fiber with metal film.

FIGS. 11(*a*), (*b*) are a process diagram of an OLED fiber of a front emission type. As shown in steps (1-6) and (7-8) of FIGS. 11(*a*), (*b*), a pattern 111 is formed for making a metal film on a one-dimensional substrate metal film fiber 110 into connection terminals to an underlay electrode and an SOI substrate in pixels and next an insulating film 113 is formed on the semicircular part opposite to a luminescence part including the said terminal part. A through hole to a terminal of the underlay metal is also formed at the same time as the time of forming a pattern of this insulating film. Next, an ITO reinforcing metal electrode 112 is formed so as not to overlap the terminal part on the said insulating film, but at this time, part of the metal film forms a connection terminal to the underlay terminal electrode on the insulating film 113 through a through hole. Next, as shown in steps (19), (20-23) and (25) of FIGS. 11(*a*), (*b*), a cathode electrode 114 and an organic EL layer 115 are mask-deposited so as no to extend to the lower semicircle and an ITO 116 is mask-deposited so as to come into contact with the reinforcing electrode and thereby an OLED portion is formed. As shown in steps (26) of FIGS. 11(*a*), (*b*), the whole of them is covered with a transparent photosensitive resin 117, which is optically hardened except the above-mentioned terminal part and the terminal part forms a through hole by means of development and here a connection bump to the SOI substrate is formed by means of ink jet, dispenser or the like.

A concrete method of performing the above-mentioned processes, a method of fabricating a device structure and a principle of a fabricating apparatus are described in the following.

The whole fabricating process is roughly divided into four processes and a flow diagram of the roughly divided processes is shown in FIG. 12. Since a fiber one-dimensional substrate fabricating process corresponds to a process of fabricating a wafer or an SOI substrate by means of an existing two-dimensional technology, it may be thought to be independent of a display fabricating process. A segment arraying process is a process of cutting these one-dimensional substrates suitably for a display size, arranging and fixing them on the surface of a cylinder or a polygonal prism or on the inner face of a cylinder, and making them newly into a "substrate" in a fabricating process of TFT and OLED. A fabricating process of TFT and OLED is the same as that of a two-dimensional substrate as a process flow as described above. The last process is a process of assembling the finished fibers into a product.

This embodiment adopts an HD-TV of 16:9 in aspect ratio and 50" in diagonal length and a 15" SXGA as concrete objects as display. In the former, in full specifications the definition is 1080×1920 (the display screen size is 1106×622 mm), the pixel size is 0.576×0.576 mm, and the pitch of each color of R, G and B is 0.192 mm. As the method, a combined type was used and a quartz fiber of 125 µm square was used as TFT and a quartz fiber of 125µφ in diameter was used size is 228.6×304.8 mm, in case of 15" display, the definition is 1024×1280, the pixel size is 0.223×0.223 mm, and the pitch of each color of R, G and B is 0.08 mm, and a fiber of 70 µm square and a fiber of 70µφ in diameter were used. The length of fiber for each color of the HD-TV is about 1200 m. Since the throughput time of an existing large-sized two-dimensional substrate is about 60 seconds, the traveling speed in a fiber one-dimensional substrate fabricating process was set at about 20 m/sec for the same throughput as this.

Figure 13:
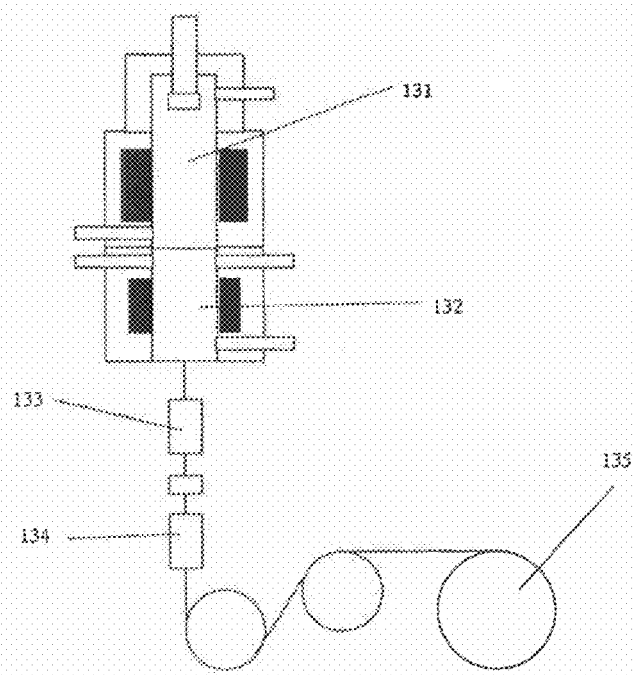
FIG. 13 is a figure showing the concept of an apparatus for fabricating an SOI fiber, an ITO fiber or the like being a one-dimensional substrate.

FIG. 13 shows a fabricating principle of a one-dimensional substrate of SOI, ITO or the like using a quartz fiber. Symbol 131 is a conventional quartz fiber drawing stage, in which a quartz fiber of a specified diameter was formed and next, in stage 132 an Si film was formed as Si crystal in a high-temperature atmosphere by means of CVD, thermal spraying, molten liquid coating-cooling and the like, and was applied with resist as a protective film in stages 133 and 134 for winding the fiber, and was wound around a roll 135. In the stage 132, an apparatus adapted to ITO, metal films and the like is used and a substrate is formed in similar processes in the following.

Figure 14:
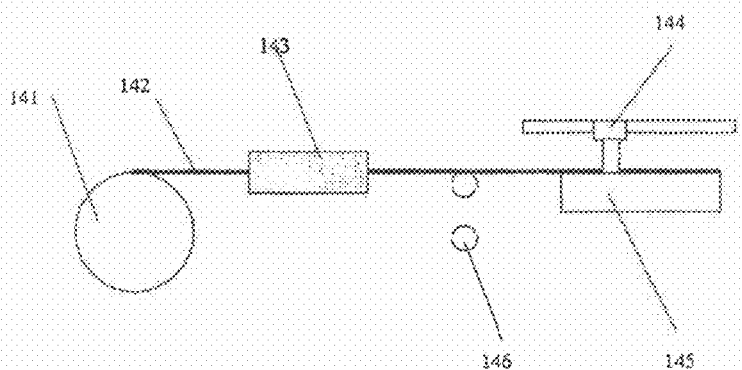
FIG. 14 is a figure showing the concept of an apparatus segmenting and arranging a one-dimensional substrate on a substrate jig surface in order to make the segmented substrates into a processed substrate.

FIG. 14 shows a principle diagram of a segment arraying process. A fiber 142 covered with a protective film of resist is drawn out from a roll 141 having a one-dimensional substrate wound around it, is stripped of the resist and is washed in a stage 143 on the way, and the fibers segmented by a cutting and arranging apparatus 144 are fixed on the surface of a "substrate jig" 145 being a "processed substrate" making jig.

Figure 15A:
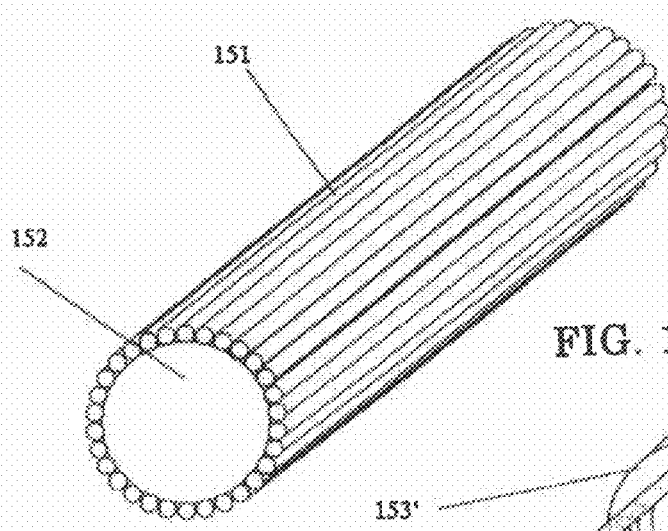
FIGS. 15(a), (b), (c) are figures three kinds of configuration examples for forming segmented fibers into a "processed substrate".

FIGS. 15(*a*), (*b*), (*c*) show conceptual diagrams of "processed substrates" formed by a segment arraying process. Symbol 151 shown in FIG. 15(*a*) is a segmented fiber and symbol 152 is a fixing jig for making these fibers into a "processed substrate". Various structures are applied to this fixing jig, but a fundamental structure is a cylinder, a round column or a polygonal prism having a rotation shaft and has grooves for positioning fibers formed on the surface of it along the axial direction. Although not explicitly shown in the figure, fibers on the jig are fixed at both ends.

Figure 15B:
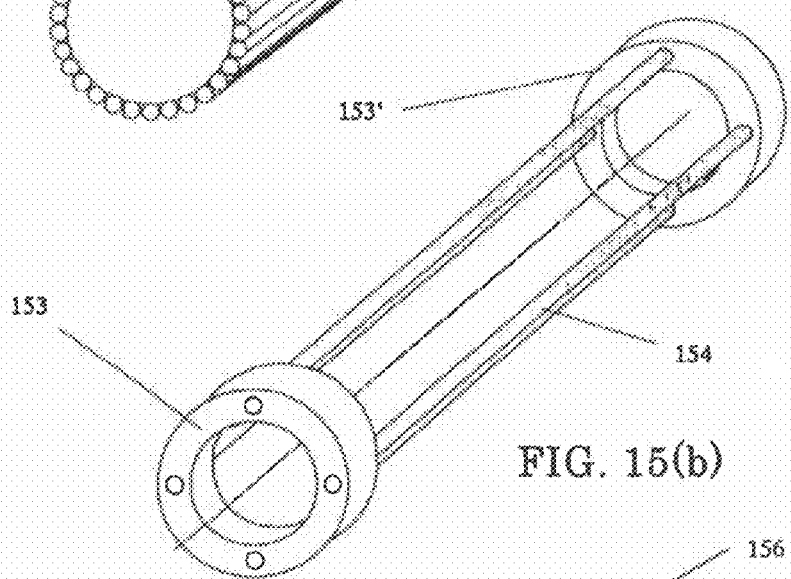
FIG. 15(b) shows a substrate jig having a fixing portion both ends of which are ring-shaped and a lattice-shaped intermediate portion.

Another fundamental structure is a structure having two rings 153 and 153' joined by supports 154 as shown in FIG. 15(b) and in this case also, has grooves for positioning fibers formed on the surface of the rings, and has a configuration for keeping the fibers straight by means of fixing and tension at both ends. In case of a cylindrical shape, the said jig is 76.4φ in diameter and 622 mm in effective length for a 50" HD-TV, and 28.5φ in diameter and 229 mm in effective length for 15" SVGA. Therefore, it has a "footprint" of 1/14 for an HD-TV and 1/10 for a 15" display in comparison with a flat substrate, and as a result, can realize making the apparatus greatly small-sized.

Figure 15C:
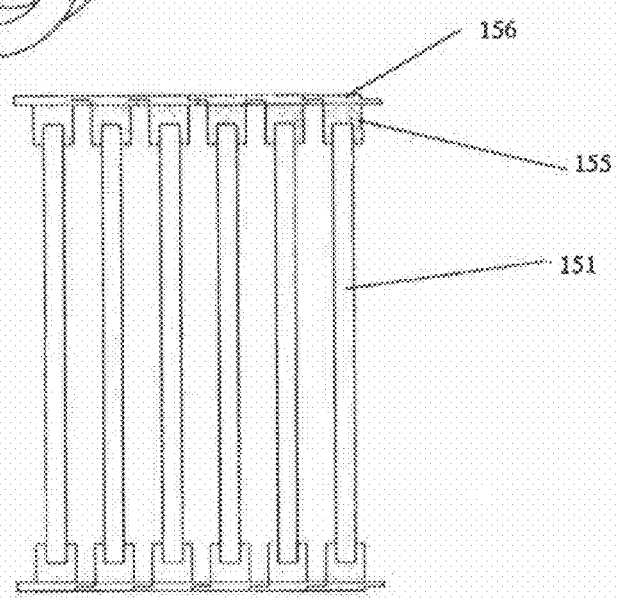
FIG. 15(c) shows a processed substrate being in the shape of a "reed screen" made by arranging in rows fibers having micro-clamp heads at both ends.

Further another structure holds both ends of fibers 151 with micro-clamps 155 and fixes them on a chain 156, as shown in FIG. 15(c), and this is hereinafter referred to as a "reed screen-shaped substrate". This is a form convenient for a roll-to-roll processing method as used for an organic film. Processing of each face of a fiber is made easy by using a structure being a simple clamp and at the same time being able to turn within a certain angle as the micro-clamp 155. The micro-clamp can be naturally used in said cylindrical substrate also.

Processes of TFT and OLED described in FIGS. 9 to 11 use the same processes and film materials as existing processes of a two-dimensional substrate. Metal materials for electrodes, wiring and the like are W, tungsten silicide, Ti, Al and the like, and inorganic insulating materials are $SiO_2$, SiN and the like, and organic insulating materials are photosensitive transparent resins. As a film forming method, sputtering, ion cluster beams, metal spraying and the like are used in case of metal films, and various kinds of CVD are used in case of insulating films. Principle figures of these film forming methods for a cylindrical substrate are shown in FIGS. 16(a), (b), (c).

Figure 16A:
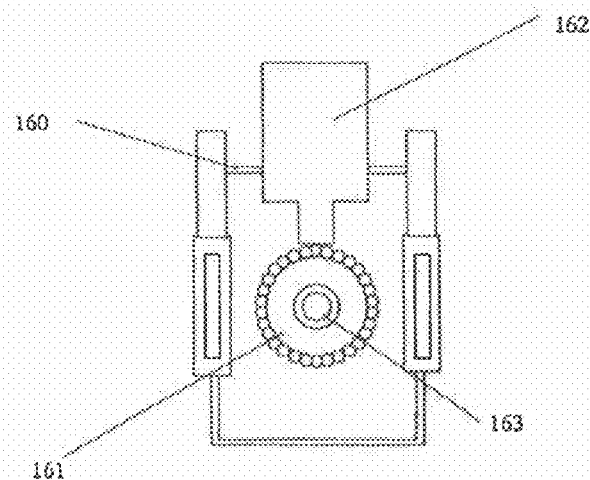
FIGS. 16(a), (b), (c) are figures showing principles of apparatuses for film formation, dry etching, impurity doping and the like on a cylindrical substrate.

FIG. 16(a) is a form in which there is installed a process head 162 generating a convergent beam-shaped or concentrated plasma state such as ion cluster beams, metal spraying, atmospheric pressure plasma or the like in a vacuum chamber 160, and is a method of one-dimensionally forming films in the axial direction of a cylindrical substrate 161. Film formation and processing of the whole surface of the substrate are performed by means of a rotating mechanism 163.

Figure 16B:
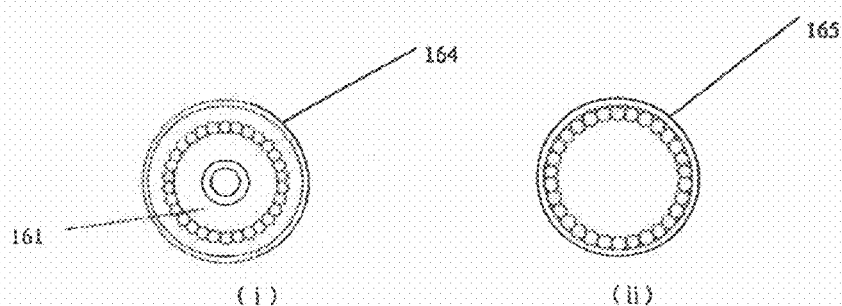
FIGS. 16(c)(i), (c)(ii) show methods of sputtering apparatuses corresponding to FIG. 16(b)(i), (b)(ii).

FIG. 16(b) shows two forms of cylinder-type CVD apparatuses. FIG. 16(b)(i) is the case that there is a cylindrical substrate 161 inside an external cylinder 164, and (ii) is a method in which fibers are fixed on the inner wall of a cylindrical substrate 165, and in this case the cylindrical substrate forms the external wall of a CVD apparatus.

Figure 16C:
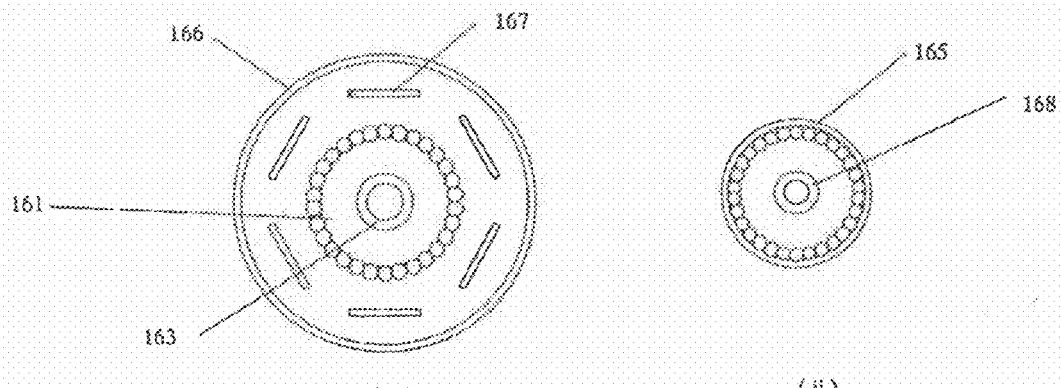

FIG. 16(c) is a method of a sputtering apparatus corresponding to FIG. 16(b), and in FIG. 16(c)(i), an external cylinder 166 forms a vacuum chamber, inside which one or plural sputtering targets 167 are set and film formation is performed on the whole surface of the cylindrical substrate 161 by means of a rotating mechanism 163. In FIG. 16(c)(ii), a method in which a cylindrical substrate itself is a substrate holder and serves also as the external wall of a vacuum chamber according to circumstances, and a sputtering target 168 is set on the central axis.

Dry etching and the apparatus are essentially the same process and apparatus principle as plasma CVD (P-CVD) and sputtering in film formation. That is to say, dry etching is performed by either method that the process head introduces an etching gas for atmospheric pressure plasma in FIG. 16(a), or changes a CVD gas to an etching gas in FIG. 16(b), or uses only electrodes instead of targets in FIG. 16(c).

Figure 17:
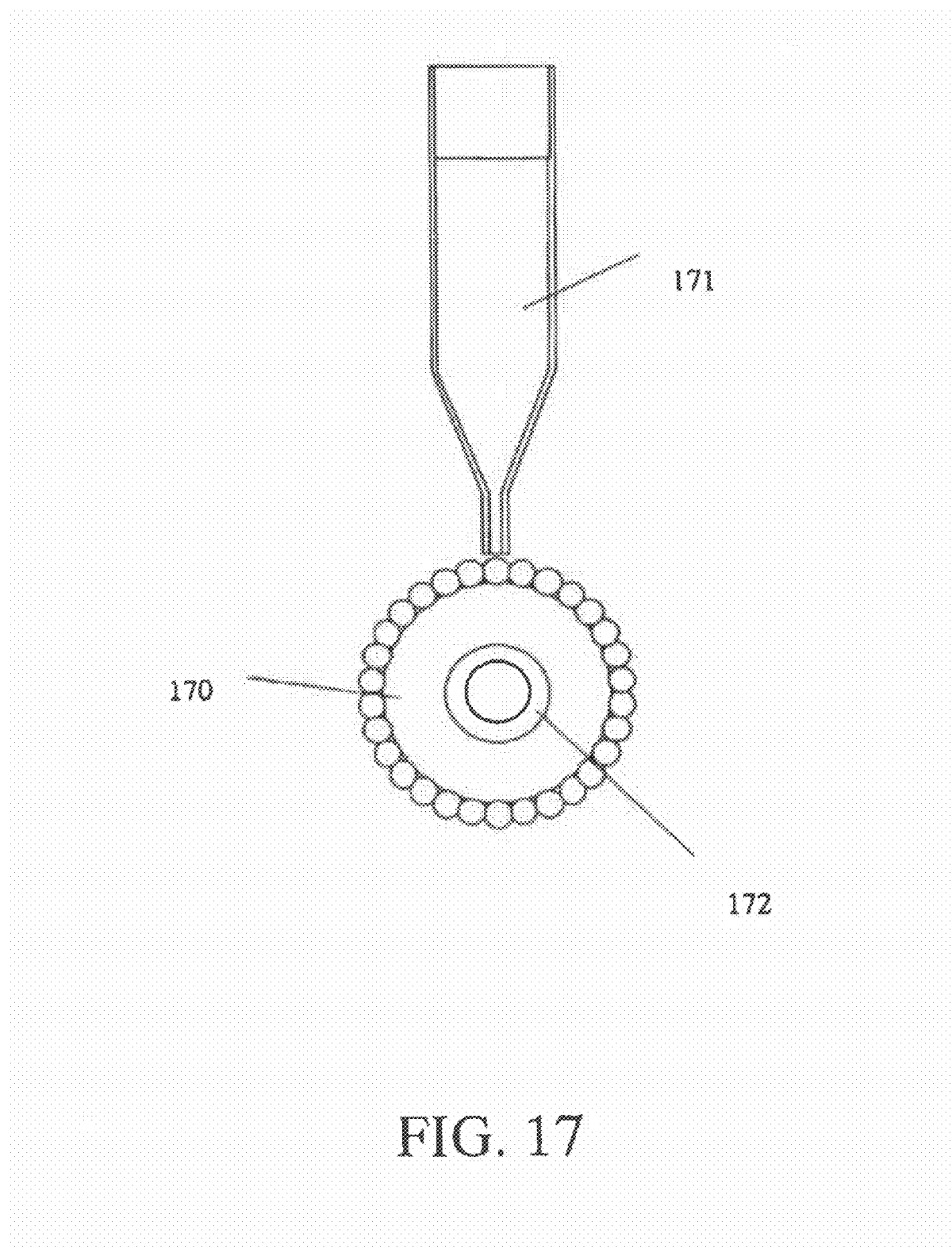

Although various methods and apparatuses for film formation and dry etching have been described above, a similar photolithography to a two-dimensional substrate is applied to a cylindrical substrate in pattern formation. FIG. 17 shows a concept of a resist applying method. Symbol 171 in the figure is a configuration for pouring out a resist agent from a slit onto a cylindrical substrate 170, rotates the cylindrical substrate by means of a rotating mechanism 172, and applies the resin agent uniformly on the whole surface. In case of a jig of a type of FIG. 15(b), there is adopted a method of forming a uniform resist layer on the whole surfaces of fibers by dipping the whole cylindrical substrate in a liquid resist and rotating it around the central axis. The cylindrical substrate applied with resist is pre-baked in a cylindrical baking furnace.

Figure 18:
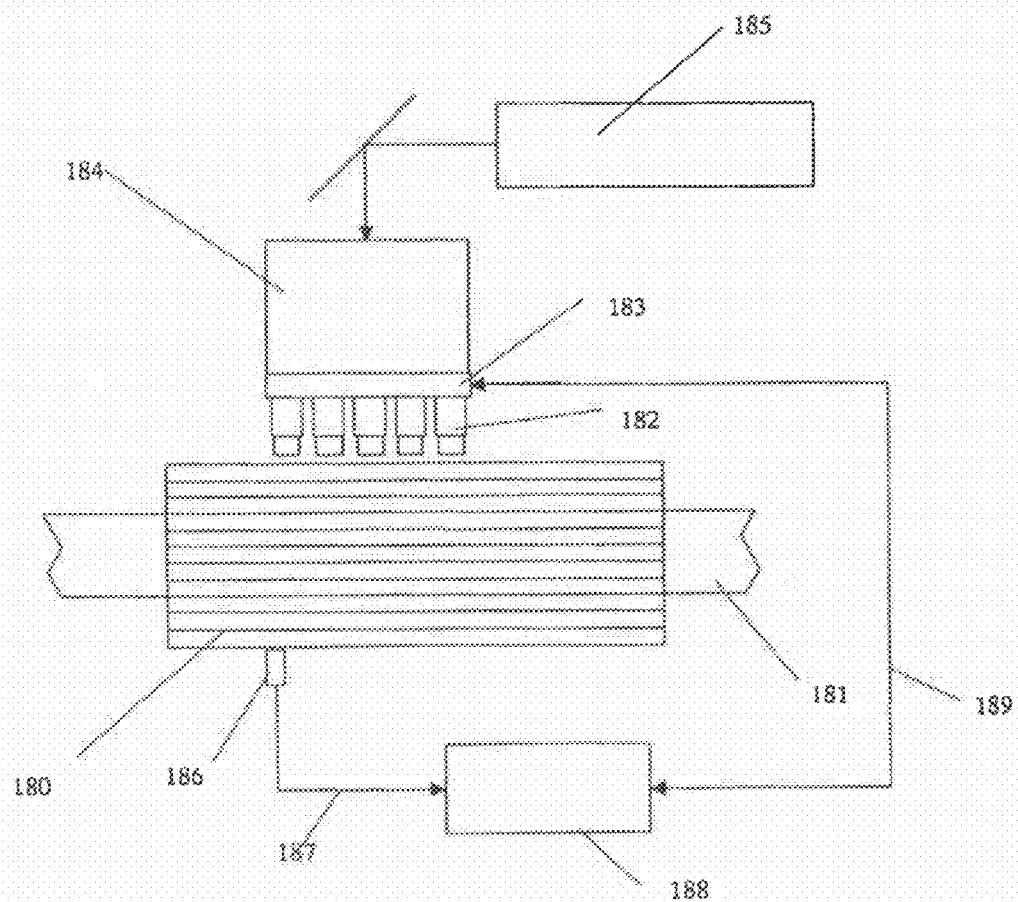
FIG. 18 is a figure showing a principle of a high-accuracy exposure apparatus.

FIG. 18 shows a conceptual figure of a high-accuracy exposing apparatus used for a pixel circuit TFT. The exposing apparatus is of a method of exposing fibers, fiber by fiber, on a cylinder- or polygonal prism-shaped substrate 180, and symbol 181 in the figure is a mechanism turning the substrate around the central axis and simultaneously moving it in the axial direction also. Symbol 182 is a 5:1 reducing projection image forming lens of 5 $mm^2$ in exposure area and a plurality of the projection lenses are coupled to each other. For alignment, a servo control mechanism 183 controls each lens independently in the three directions of X-, Y- and Z-axes. As for control data, the servo control of the lens system is performed by reading the positional coordinates of each fiber at a high speed by means of an optical head 186 for detection at the stage precedent to exposure, inputting the read positional data through a transmission line 187 into a memory and computation system 188, and transmitting a control signal from the memory and computation system 188 through a transmission line 189 to the servo control mechanism 183. A mechanical probe for sensing the side face of a fiber may be used in place of an optical head. An excimer laser of 308 nm or 248 nm in wavelength is used as a light source 185 of this exposure system. An illumination optical system 184 is a conventional Koehler illumination system and uses cylindrical lenses and the like, and its illumination area is 0.2 mm in width, corresponds to the length of the image forming lens system having lenses coupled and is in the shape of a slit of at least 250 mm in length.

Figure 19:
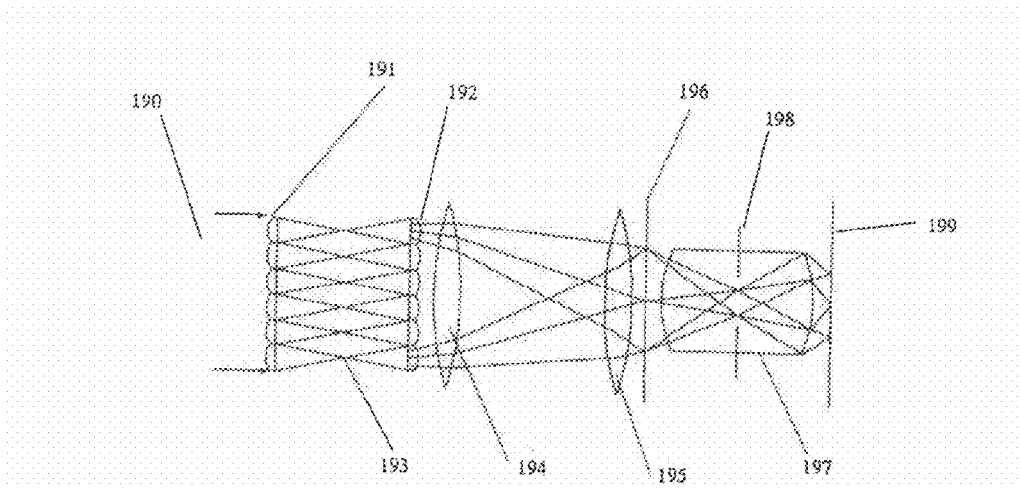
FIG. 19 is a figure showing a principle of an illumination optical system.

FIG. 19 shows an equivalent optical system of the exposure optical system. Collimated light 190 of an excimer laser made into an appropriate shape is made into a secondary light source by split lenses 192, and the secondary light source 193 and a condenser lens 194 irradiates a mask 196 with a light uniformly distributed in a specified shape. A field lens 195 forms a secondary light source image in an entrance pupil 198 of the image forming lens 197 to form a mask image on an image plane 199. The optical system of 190 to 195 in the figure represents a slit-shaped illumination in the direction of X- or Y-axis and practically consists of two optical systems. This is a common optical system but is separated into individual optical systems after the field lens 195.

The output of the excimer laser in this case is 10 W at 2 kHz, namely, 5 mJ/1 shot. Therefore, the energy density of the slit-shaped illumination part is 10 $mJ/cm^2$ at the light source and comes to be 5 $mJ/cm^2$ on the assumption that loss in the optical system is 50%. Since a necessary dose of a chemical sensitizer resist is about 30 $mJ/cm^2$, the exposure of 6 shots/site is necessary. The effect of spatial coherence of the excimer laser is also cancelled by the 6 shots. Therefore, the total number of shots onto a cylindrical substrate for 50" HD-TV is 633/50×1920×6=149760, which makes a laser of 2 kHz need 75 seconds and the necessary time of a high-accuracy exposure process including a servo control time is about 2 minutes.

Figure 20:
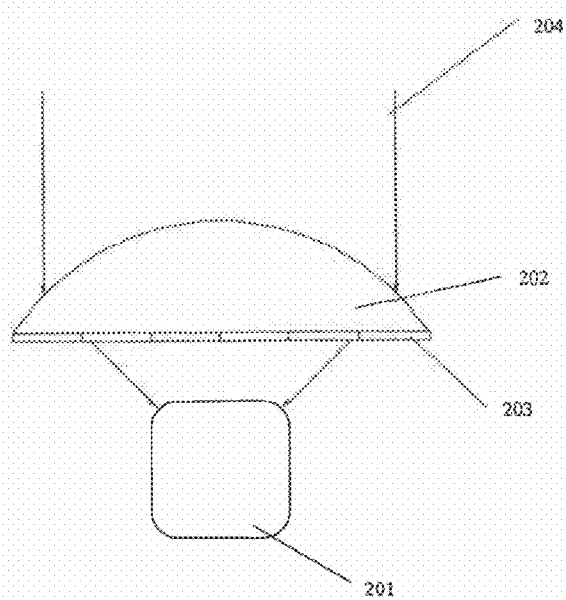
FIG. 20 is a figure showing a principle of a 1:1 proximity exposure optical system.

Although it is a pixel switch exposure method needing a high-accuracy exposure that has been described above, a 1:1 proximity exposure as shown in FIG. 20 was used in case of a pattern spreading over a wide area without requiring an accuracy as high as TFT, for example, a pattern of wiring in pixel switches and pads as well as a pattern in the axial direction of fiber and the like. A cylindrical lens 202 designed so as to condense an incident light beam 204 on the center of fiber with an angle sufficiently covering corners of a fiber 201 is placed in parallel with the fiber, and thereby a mask pattern 203 is projected along the curved surface of the fiber. One or many cylindrical lenses described above are configured so as to fit alignment with the fiber. In case of using said excimer illumination system as a light source in the said exposure, a process time is shortened to about 30 seconds due to 1:1.

FIGS. 21(a), (b), (c) show principle figures of wet processes such as development, exfoliation, wet etching, washing and the like. FIG. 12(a) is a method of processing a cylindrical substrate 221 in a horizontal-type wet tab 212 and performs a plurality of wet processes by a rotating and conveying system 213 in the tab. FIG. 21(b) is the case of using a vertical-type tab 214. FIG. 21(c) is a method adapted to a reed-screen substrate 215 in the shape shown in FIG. 15(c), and makes it pass through a wet tab 216 by means of a roller conveyer system of 217-1 to 217-3. After washed, it is dried by jetting or blowing dry and clean air, nitrogen or the like in an air knife shape.

As impurity introducing methods, two methods of ion implantation and plasma doping are used. The ion implantation uses a process head in FIG. 16(a) made into a slit-shaped ion gun. A method and apparatus for plasma doping has essentially the same process and apparatus principle as P-CVD and sputtering in film formation. That is to say, doping is performed by either method of making the process head introduce an impurity gas for atmospheric pressure plasma in FIG. 16(a), or change a CVD gas to an impurity gas in FIG. 16(b), or introduce an impurity gas using only electrodes instead of targets in FIG. 16(c). An impurity activation uses a conventional thermal annealing method. And hydrogen annealing in the process also uses a hydrogen furnace similarly to a conventional semiconductor process.

Figure 22A:
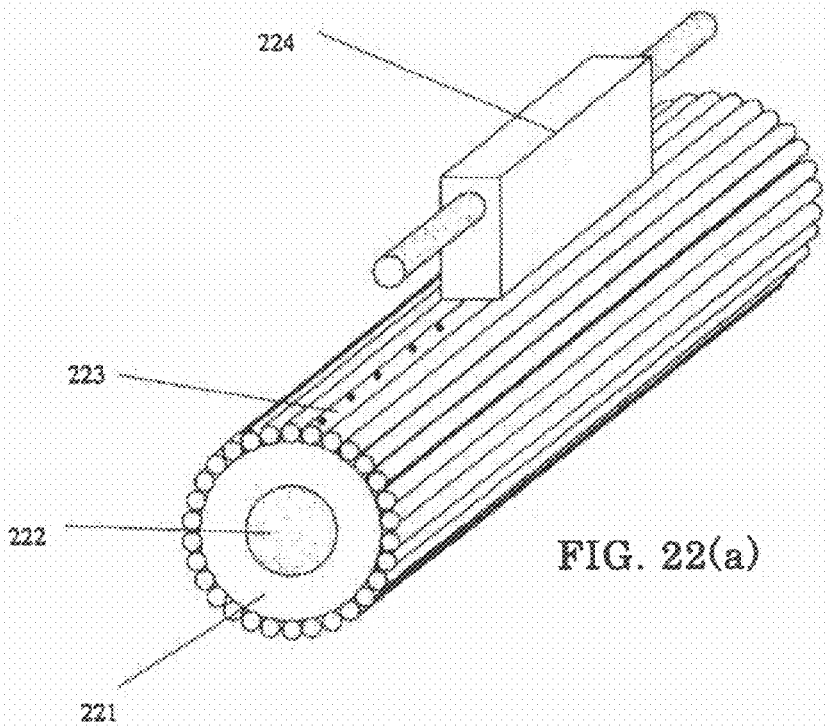
FIGS. 22(a), (b) are figures showing a principle of assembling combined fibers of TFT and OLED.
Figure 22B:
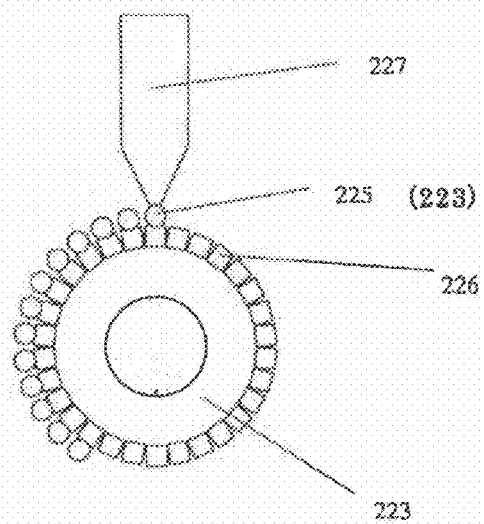

In order to make the fiber made in such a way into a two-dimensional flat display, solder or conductive adhesive able to be used at a low temperature giving no damage to OLED is first deposited on pad portions of a fiber 223 on each cylindrical substrate 221 or reed screen-shaped substrate of TFT and OLED by means of ink jet 224 or the like, as shown in FIG. 22(a). At this time the cylindrical substrate is turned and moved by a shaft 222. The movement in the axial direction may be performed by the ink jet head 224. As shown in FIG. 22(b), one 225 (223) of both fibers on which bumps have been formed in such a way is removed from the substrate or the like is aligned with and then press-joined with the other fiber 226 by means of a jig 227 for holding and press-joining both ends. A test of connection of both fibers is performed at this stage, depending on a processed substrate jig of fiber.

Figure 23A:
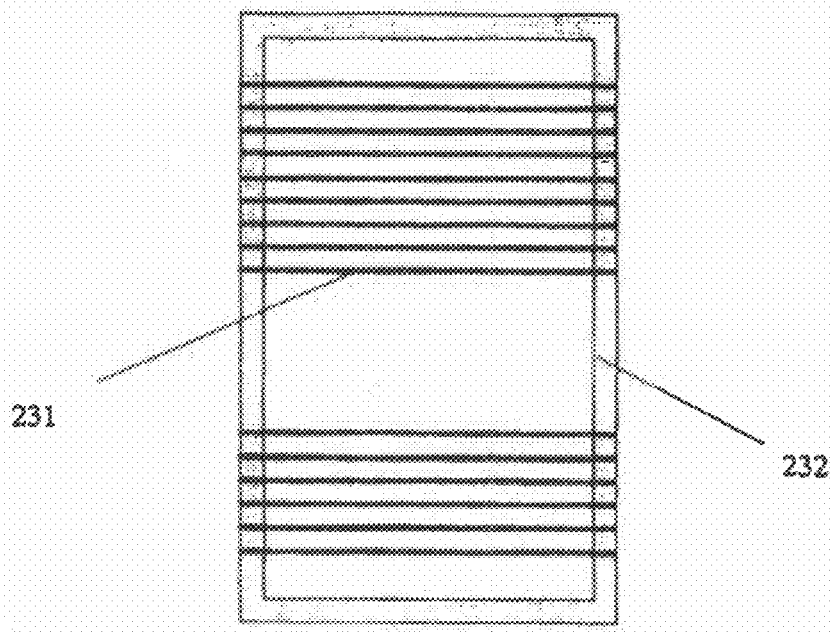
FIGS. 23(a), (b) are figures showing a method of arranging combined fibers to make a display panel.
Figure 23B:
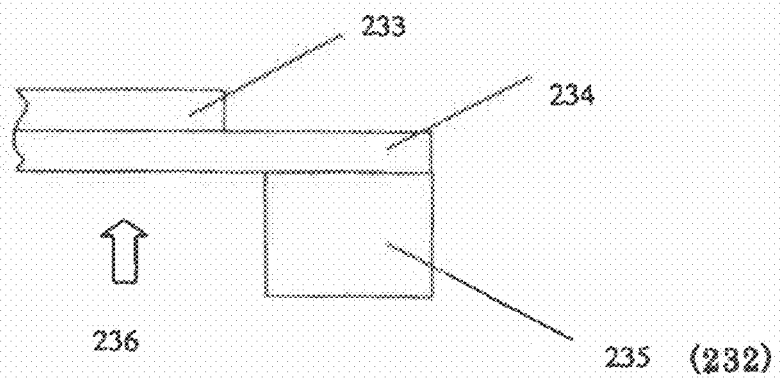
FIG. 23(b) shows a positional relation between the frame and fibers.

Next, these double fibers 231 are fixed on a fiber fixing frame 232 shown in FIG. 23(a) in order of R, G and B at intervals of pixel pitch. This frame 235 (232) is more outside than OLED fibers 233 so as not to hinder connection of gate lines described below as shown in FIG. 23(b). After the fixing, a low-melting point solder or the like is deposited on a pad for gate of TFT fiber 234 from the direction of arrow 236 by means of ink jet or the like in the same manner as described above. A connection test of both fibers may be performed at this stage. And unnecessary end portions are cut at this stage. Next, the fibers and gate lines are connected to each other.

Figure 24A:
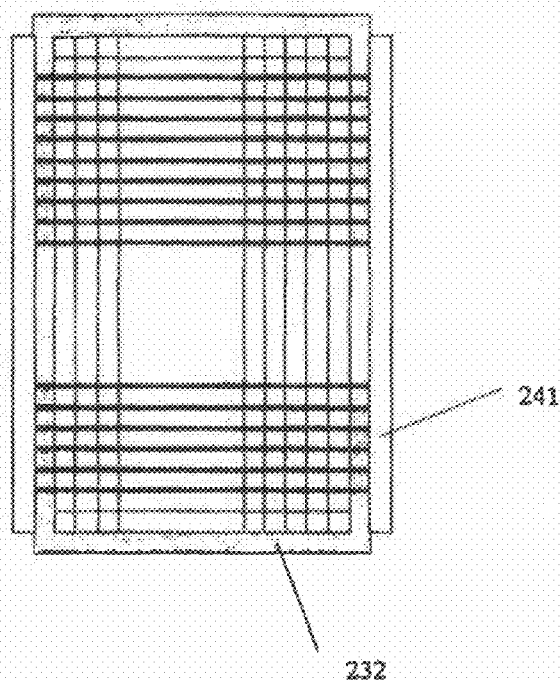
FIGS. 24(a), (b) are figures showing a method of attaching gate lines to a combined fiber array.
Figure 24B:
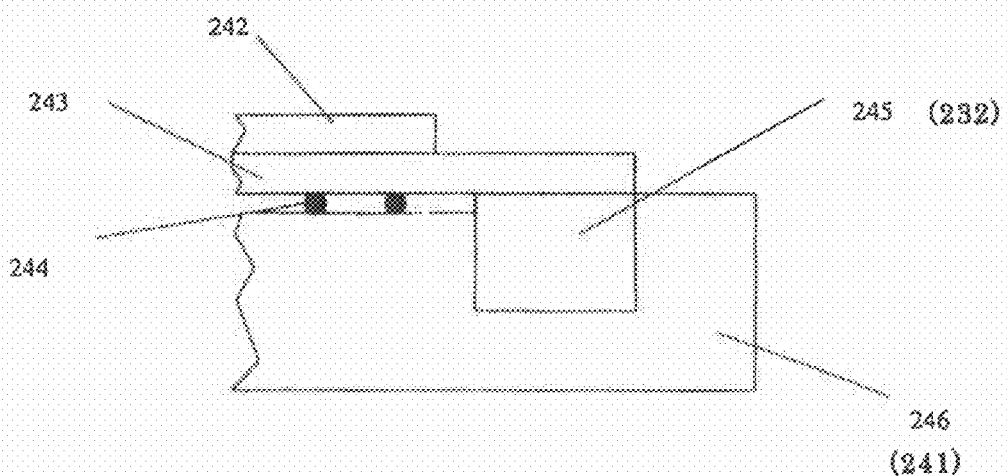
FIG. 24(b) shows a positional relation between the frame and the gate lines.

A frame 241 on which copper wires for gate are stretched at intervals of pixel pitch as shown in FIG. 24 forms partially a nested structure with a fiber fixing frame 232 shown in FIG. 23. A copper wire has a low-temperature solder put onto it in advance. A positional relation between fibers 242, 243 and the copper wires is as shown in FIG. 24(b), and the copper wires are joined with the lower faces of TFT fibers 243 under OLED fibers 242 by means of thermal press-joining or a laser micro-welder shown in FIG. 25.

Figure 25:
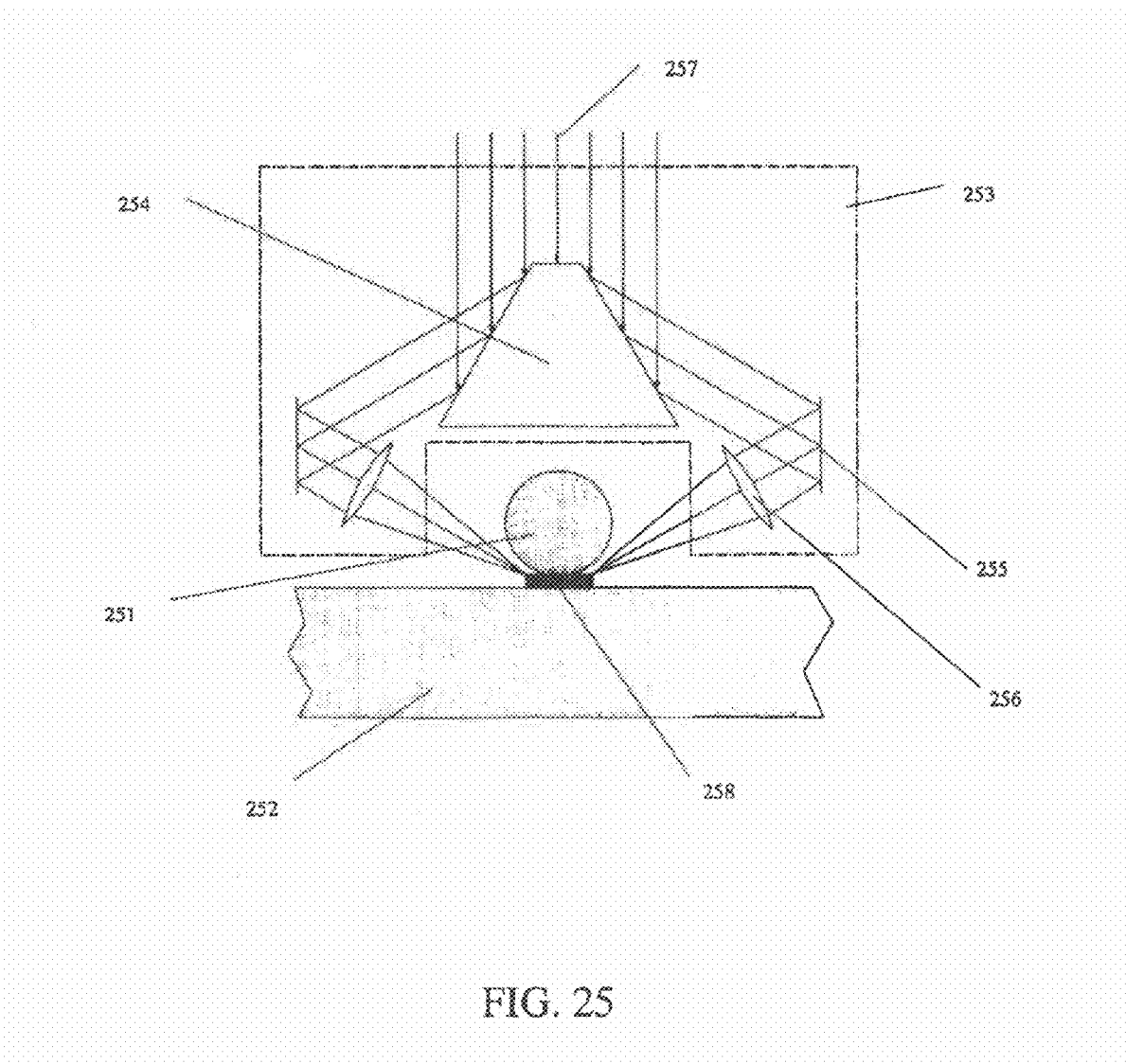
FIG. 25 is a figure showing a principle of a micro-welder.

In case of the latter, the frame of FIG. 24 is on an X-Y stage and gate lines 251 are running vertically (Y) to the page plane as shown in FIG. 25. A laser welder head emits a pulse beam synchronously with the position of a gate pad. When one gate line is finished, the frame is moved by a vertical pixel pitch by the X-stage and the same operation is performed. The gate line 251 is a conventional copper wire of 100 μm in diameter and the gap between the copper wires is 476 μm in case of a 50" HD-TV. An optical head portion 253 of the micro-welder is a micro-optics optical system composed of a trapezoidal prism 254, a mirror 255 and micro-lenses 256. A pulse laser beam 257 is split by the trapezoidal prism and is radiated onto a bump 258 on a TFT fiber 252 from both sides of a copper wire.

As a laser, the fundamental wave of a YAG laser is used and is condensed to 10 μmφ or less in diameter by the lenses 256, and thereby the bump is molten to weld. The output of an original laser light source must be in a $TEM_{00}$ mode for optical condensation of 10 μmφ or less in diameter. Due to this, a fiber being ordinarily used as a light-guide system is not used but a two-lens beam expander being as simple as possible and an optical system of FIG. 25 are used. Since the vertical pixel pitch of a HD-TV now conceived is 576 μm, when a light source of 20 kHz in oscillation frequency is used, the speed of movement becomes about 12 m/sec. A necessary time for traveling of one gate line is about 0.1 second and therefore a necessary time for traveling over the whole display screen is about 108 seconds. In practice, the operations of acceleration, deceleration, one pixel pitch movement and the like each need a little less than 0.1 second, and the necessary time for the whole display screen was about 400 seconds, namely, about 7 minutes in case of using a single head but one display plate could be completed in one minute or less by using many heads.

Figure 26A:
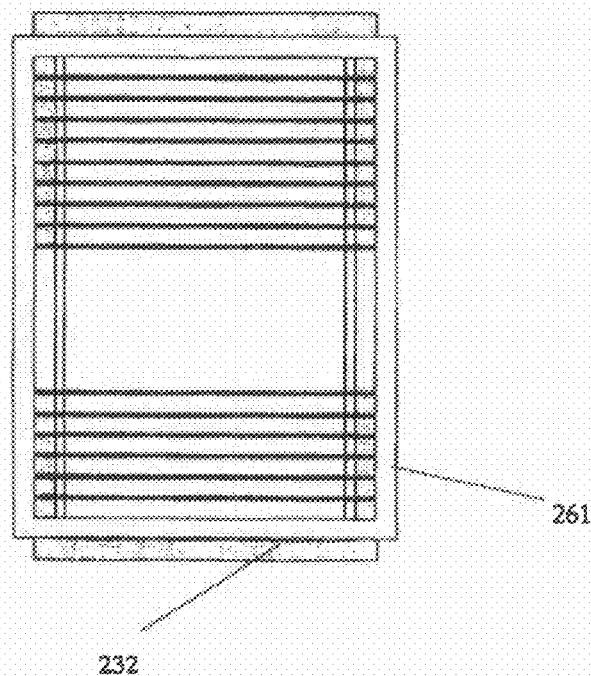
FIGS. 26(a), (b) are figures showing a method of attaching two common lines to a combined fiber array.
Figure 26B:
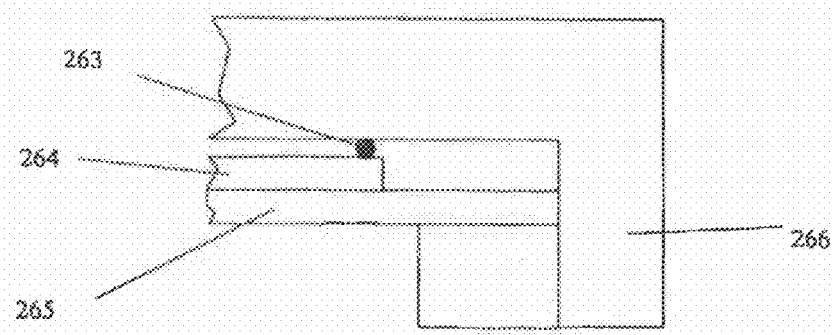
FIG. 26(b) shows a positional relation between the frame and a common line.

For connection of OLED with common electrodes, two wires are connected to OLED fibers at the ends not appearing in the display screen. Due to this, a common line frame 261 as shown in FIG. 26(a) has a structure in which two conductive wires 263 stretched on this frame are positioned over OLED fibers 264 as shown in FIG. 26(b). OLED fibers and the two common wires have a conductive adhesive for connection at a low temperature deposited on them in advance by means of ink jet or the like and thereby are thermally press-joined at a low temperature.

After the above assembly has been finished, a lighting inspection is performed using a prober, and particularly inspection of the above-mentioned connection is performed. After it has been confirmed that the connection is perfect, a signal driver IC chip, a current source, a gate driver IC chip, a common electrode and the like are mounted. A signal driver IC chip and a current source are connected to an end of a TFT fiber.

These circuit components are mounted on a flexible or rigid circuit board comprising a multilayered wiring of 0.4 mm in thickness and they each have a terminal formed for a vertical pixel column. A method of connecting them with fibers is entirely the same as described above. A gate line and a common line are disposed in the side where a flexible or rigid circuit board comprising a multilayered wiring and having similarly a gate driver IC chip and a common electrode mounted on it intersects the above-mentioned board at right angles and are connected in a similar manner. After inspection of these mounting has been ended, as shown in FIGS. 7 and 8, a black paint containing resin is poured onto the side opposite to the light output face side of fibers and next a transparent resin is poured onto the light output face side of the fibers, and the whole is shaped into a flat panel so as to be 1 mm or less in thickness to complete a display panel.

As described above, according to the present invention, an ultra-thin, large-sized and high-definition display of 2 mm or less in thickness can be manufactured at low cost. Therefore, the range of application is expanded to various applications of a full-scale wall-mounted TV, medical appliance, electronic paper and the like. Due to a quite new production apparatus, it launches a new industry and at the same time, enables the speed-up of technological innovation since the apparatus itself is small in size and low in production cost. And although the content is not referred to, a ripple effect of these apparatus and process on things other than display is great and particularly their meaning as a preceding stage leading to nano-technologies is great.

And in case of a display of a mobile phone or a display of 7 to 10 inches, an organic EL display may be made by using a flat substrate made of a silicon wafer or glass substrate having driving circuit elements formed on it and combining the flat substrate with an array of OLED fibers. In case of a relatively small-sized display, a silicon wafer process has an advantage of being capable of being procured very inexpensively since a large number of semiconductor devices are in use. However, in a display using a conventional two-dimensional substrate, it is very difficult to make a high-definition display of 50 µm or less in pixel size. The reason is that an organic EL element is made using a metal shadow mask and since a different mask is used for each color of red, green and blue, alignment must be performed for each color and it is very difficult to attain an alignment accuracy of 5 µm or less in a vacuum apparatus. As a relative positional accuracy of a mask and a substrate, it is conceivable that a processing accuracy of a mask is 3 µm or less, an alignment accuracy is about 5 µm and a slippage caused by deformation due to thermal expansion during a process is 1 to 3 µm. Accordingly, the comprehensive accuracy comes to be about 5 to 10 µm, and it is difficult to realize a pixel size equal to or less than the above-mentioned pixel size in industrial level. However, a method using a one-dimensional substrate can form and arrange organic EL films independently for each color using a reel-to-reel method. In this case, since a mask may be a shadow mask having one or several slits, the mask can be made with accuracy of 1 µm or less, and it is possible to form a film easily with high accuracy by fixing said mask and intermittently moving a one-dimensional substrate over said mask. It is a matter of course that organic EL films can be continuously manufactured by moving said mask synchronously with movement of a one-dimensional substrate.

In such a way, in case of a relatively small-sized display, an inexpensive and high-definition display can be realized by combining an OLED fiber array with a TFT circuit substrate made of a two-dimensional substrate. In case of using a silicon wafer, since the performance of TFT is more excellent in comparison with polycrystalline TFT, its high-speed response can be improved, its circuit also can have a complicated function added to it, and its color compensation and the like can be also improved.

What is claimed is:

1. A device fabricating method comprising the steps of:
    drawing out a fiber having a semiconductor layer or an insulating layer formed on the surface of said fiber and further being covered with a protective film from a take-up jig;
    removing said protective film drawn out from said take-up jig;
    cutting and separating a portion, from which said protective film has been removed, of said fiber in necessary lengths and into plural fibers;
    fixing said plural fibers on an outer surface or inner surface of an annular face; and
    forming at least one-side elements of active elements and passive elements on said fibers on said annular face.

2. A device fabricating method according to claim 1, wherein said annular face is one of a surface of a cylinder or a polygonal prism or the inner surface of a tube.

3. A device fabricating method according to claim 1, further comprising a step of disposing a process head over said fiber on said annular face, turning said annular face and successively growing films one-dimensionally on said fibers.

4. A device fabricating method according to claim 1, further comprising a step in which said fiber is placed in a film forming atmosphere in a state where said fiber is fixed on said annular face.

5. A device fabricating method according to claim 1, further comprising a step of disposing a process head over said fiber, turning said annular face and successively applying resist to said fibers.

6. A device fabricating method according to claim 5, further comprising a step of disposing a lens system of an exposure apparatus over said fiber, turning said annular face and successively exposing resist on said fibers.

7. A device fabricating method according to claim 1, further comprising a step in which said fibers are immersed in a solution together with said annular face and are wet-processed.

8. A device fabricating method comprising the steps of:
    drawing out a fiber having a semiconductor layer or an insulating layer formed on the surface of said fiber and further being covered with a protective film from a take-up jig;
    removing said protective film drawn out from said take-up jig;
    cutting and separating a portion, from which said protective film has been removed, of said fiber in necessary lengths and into plural fibers;
    mounting said plural fibers on a fixing jig at some intervals; and
    forming at least one-side elements of active elements and passive elements on said fibers fixed on said fixing jig.

* * * * *